(12) United States Patent
Nakamizo et al.

(10) Patent No.: US 8,654,325 B2
(45) Date of Patent: Feb. 18, 2014

(54) SUBSTRATE PROCESSING APPARATUS, SUBSTRATE PROCESSING METHOD, AND COMPUTER-READABLE STORAGE MEDIUM HAVING PROGRAM FOR EXECUTING THE SUBSTRATE PROCESSING METHOD STORED THEREIN

(75) Inventors: Kenji Nakamizo, Koshi (JP); Satoshi Morita, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1 day.

(21) Appl. No.: 13/540,723

(22) Filed: Jul. 3, 2012

(65) Prior Publication Data
US 2013/0010289 A1 Jan. 10, 2013

(30) Foreign Application Priority Data

Jul. 5, 2011 (JP) .................................. 2011-149364
Jul. 5, 2011 (JP) .................................. 2011-149365

(51) Int. Cl.
*G01N 21/88* (2006.01)
(52) U.S. Cl.
USPC ..................................... 356/237.2; 356/237.1
(58) Field of Classification Search
USPC .......................................... 356/237.1–237.5
See application file for complete search history.

(56) References Cited

U.S. PATENT DOCUMENTS

| 5,978,078 | A * | 11/1999 | Salamati-Saradh et al. ........................ 356/237.1 |
| 6,798,504 | B2 * | 9/2004 | Sato et al. .................. 356/237.2 |
| 6,897,949 | B2 * | 5/2005 | Takeishi ..................... 356/237.3 |
| 7,620,232 | B2 * | 11/2009 | Sakai et al. ................... 382/141 |

FOREIGN PATENT DOCUMENTS

| JP | 2003-229403 A | 8/2003 |
| JP | 2006-140259 A | 6/2006 |

* cited by examiner

*Primary Examiner* — Sang Nguyen
(74) *Attorney, Agent, or Firm* — Abelman, Frayne & Schwab

(57) ABSTRACT

Provided is a substrate processing apparatus including a placement table on which a substrate is disposed; a light source configured to irradiate light on the surface of the substrate on the placement unit; a detector configured to detect the light amount reflected from the substrate; and a control unit configured to perform a determination process of determining whether a detection value of the light amount is smaller than a predetermined value at a plurality of positions, and to determine that a holding state of the substrate is abnormal when the total number of times of determination in which it is determined that the detection value is smaller than the predetermined value reaches a predetermined number of times.

18 Claims, 19 Drawing Sheets

SUBSTRATE PROCESSING APPARATUS, SUBSTRATE PROCESSING METHOD, AND COMPUTER-READABLE STORAGE MEDIUM HAVING PROGRAM FOR EXECUTING THE SUBSTRATE PROCESSING METHOD STORED THEREIN

CROSS-REFERENCE TO RELATED APPLICATIONS

This application is based on and claims priorities from Japanese Patent Application Nos. 2011-149364 and 2011-149365, both filed on Jul. 5, 2011, with the Japanese Patent Office, the disclosures of which are incorporated herein in their entireties by reference.

TECHNICAL FIELD

The present disclosure relates to a substrate processing apparatus, a substrate processing method, a storage medium having a program for executing the substrate processing method stored therein.

BACKGROUND

In a manufacturing process of a semiconductor device or a manufacturing process of a flat panel display (FPD), a process of performing processing by supplying a processing liquid to various substrates such as a semiconductor wafer or a glass substrate is frequently used. Examples thereof may include a cleaning process using various kinds of processing liquids for removing particles attached to the surface of a substrate or a native oxide layer formed by contact with the atmosphere.

A substrate processing apparatus performing a process such as a cleaning process as described above on a substrate is used, which includes a plurality of substrate processing units of a single wafer type and a transport unit. The transport unit carries-in/out a substrate into/from these substrate processing units.

The substrate processing unit includes, for example, a rotary table, a plurality of holders and a nozzle head. The holders are installed on the rotary table in plural and hold a circumferential edge of a substrate which is disposed on the rotary table by the transport unit. The nozzle head is positioned on a top surface side of the rotary table and supplies, for example, a processing liquid on a top surface of the substrate disposed on the rotary table.

Some of the substrate processing apparatuses have a detector for detecting a holding state of the substrate held by the holders (see, for example, Japanese Patent Application Laid-Open No. 2003-229403). The detector includes a light source and a light receiving element. The light source emits light including, for example, a laser beam and is disposed above the rotary table outward in a diameter direction of the rotary table. As in the light source, the light receiving element is disposed above the rotary table outward in the diameter direction of the rotary table. The light receiving element is disposed such that light, which is irradiated from the light source and reflected from the top surface of the substrate, is incident on the light receiving element, and a holding state of the substrate is detected by detecting an angle of the substrate held by holders with respect to the horizon based on a variation in light amount of light which is incident on the light receiving element.

SUMMARY

An exemplary embodiment of the present disclosure provides a substrate processing apparatus of processing a substrate, including: a placement table on which the substrate is disposed; a light source configured to irradiate light on the surface of the substrate on the placement table; a detector configured to detect the light amount reflected from the surface of the substrate; and a control unit configured to perform a determination process of determining whether a detection value of the light amount is smaller than a predetermined value at a plurality of positions, and to determine that a holding state of the substrate is abnormal when the total number of times of determination in which it is determined that the detection value is smaller than the predetermined value reaches a predetermined number of times.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
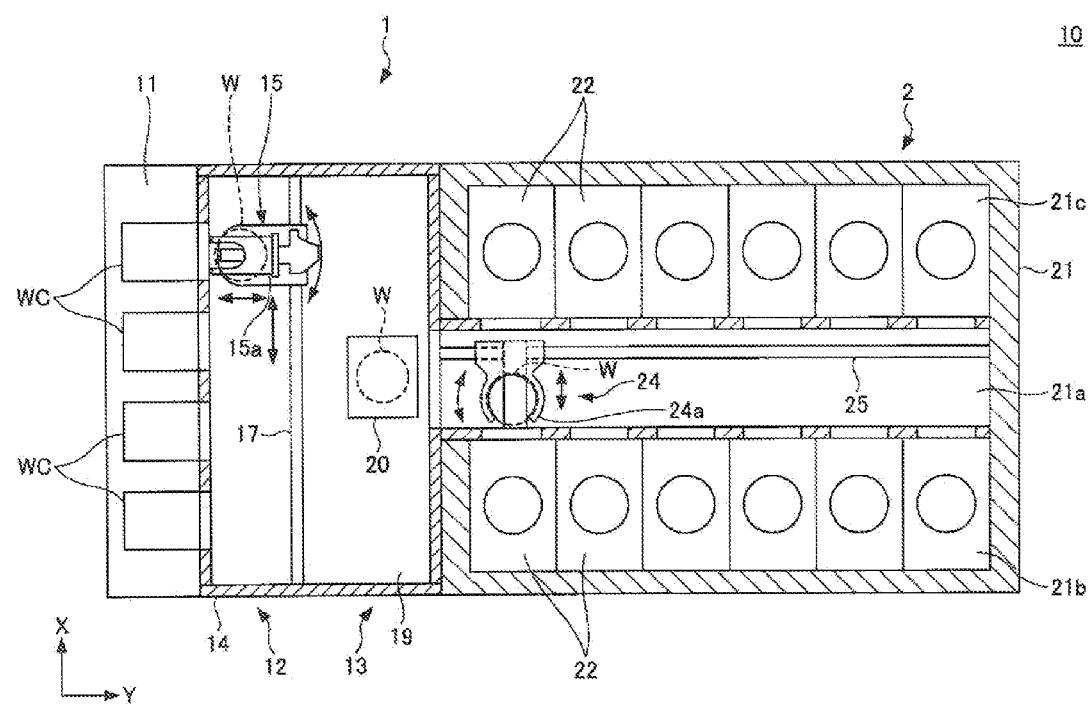
FIG. 1 is a plan view illustrating a schematic configuration of a substrate processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

A substrate processing method in the substrate processing apparatus has the following problems.

For example, when the laser beam is reflected from the top surface of the substrate, the assumed light amount may not be detected. For this reason, even though the substrate is held properly in actual fact, it is determined that the substrate is not properly held, and the holding state of the substrate may be erroneously detected. When a detection position of the substrate is changed, the holding state of the substrate may be erroneously detected depending on the detection position. The present inventors found out that such erroneous detection results are generated from, for example, the effect of a kind of layers formed on the substrate, and a surface state of a layer processed on the substrate.

The present disclosure has been made in an effort to provide a substrate processing apparatus and a substrate processing method that can exactly detect a holding state of a substrate without being affected by, for example, a kind of layers formed on the substrate, a surface state, and a detection position of the substrate.

In order to solve the problems, the present disclosure takes means described below.

An exemplary embodiment of the present disclosure provides a substrate processing apparatus of processing a substrate, including: a placement table on which the substrate is disposed; a light source configured to irradiate light on the surface of the substrate on the placement table; a detector configured to detect the light amount reflected from the surface of the substrate; and a control unit configured to perform a determination process of determining whether a detection value of the light amount is smaller than a predetermined value at a plurality of positions, and to determine that a holding state of the substrate is abnormal when the total number of times of determination in which it is determined that the detection value is smaller than the predetermined value reaches a predetermined number of times.

The substrate processing apparatus as described above further includes a rotation unit configured to rotate the substrate together with the placement table about the center of the placement table as a rotation axis. The control unit performs the determination process several times while consecutively changing the detection position by the rotation unit.

In the substrate processing apparatus as described above, when the control unit performs the determination process several times, if it is determined that the detection value is smaller than the predetermined value consecutively for the predetermined number of times, the control unit determines that the holding state of the substrate is abnormal.

The substrate processing apparatus as described above further includes: a plurality of holders each configured to hold a circumferential edge of the substrate disposed on the placement table. The control unit performs the determination process several times while changing the detection position of the substrate from a first detection position corresponding to one holder to a second detection position corresponding to another holder next to the one holder.

In the substrate processing apparatus as described above, the light source irradiates light to an area other than the center of the substrate on the surface of the substrate.

In the substrate processing apparatus as described above, the control unit performs the determination process before the substrate is processed and performs the determination process after the substrate is processed.

Another exemplary embodiment of the present disclosure provides a substrate processing method of processing a substrate, including: holding the substrate disposed on a placement table by a holder; irradiating light on the surface of the substrate on the holder; detecting the light amount reflected from the surface of the substrate by a detector; and determining whether a detected value of the light amount is smaller than a predetermined value. The detecting is performed at a plurality of positions of the substrate, and the determining determines that the holding state of the substrate is abnormal when the total number of times of determination in which it is determined that the detection value is smaller than the predetermined value reaches a predetermined number of times.

In the substrate processing method as described above, the detecting is performed several times while the detection position is consecutively changed by rotating the substrate on the holder about the center of the placement table as a rotation axis.

In the substrate processing method as described above, when the determining is performed several times, if it is determined that the detection value is smaller than the predetermined value consecutively for the predetermined number of times, it is determined that the holding state of the substrate is abnormal.

In the substrate processing method as described above, a plurality of holders are installed at regular intervals along an outer circumference of the substrate to hold a circumferential edge of the substrate, the detecting is performed while the detection position of the substrate is changed from a first detection position corresponding to one holder to a second detection position corresponding to another holder next to the one holder, and when the determining is performed several times, if the total number of times reaches the predetermined number of times, it is determined that the holding state of the substrate is abnormal.

In the substrate processing method as described above, the detecting detects the light amount irradiated to an area other than the center of the substrate on the surface of the substrate and reflected from the area.

In the substrate processing method as described above, the determining is performed before the substrate is processed, and the determining is preformed after the substrate is processed.

An yet another exemplary embodiment of the present disclosure provides a non-transitory computer-readable storage medium storing a computer program that, when executed, cause a computer to perform the substrate processing method as described above.

An strill yet another exemplary embodiment of the present disclosure provides a substrate processing apparatus of processing a substrate, including: a placement table on which the substrate is disposed; a light source configured to irradiate light on the surface of the substrate on the placement table; a detector configured to detect a light amount reflected from the surface of the substrate; and a control unit configured to perform a detection process of detecting the light amount using the detector at a plurality of positions, accumulate the detection values of the light amount, and determine that a holding state of the substrate is abnormal when the accumulated value is smaller than a predetermined value.

In the substrate processing apparatus as described above, the control unit performs the detection process several times, accumulates the detection values as analog data, and when the accumulated value is smaller than the predetermined value, the control unit determines that the holding state of the substrate is abnormal.

The substrate processing apparatus as described above further includes: a rotation unit configured to rotate the substrate together with the placement table about the center of the placement table as a rotation axis; and a plurality of holders each configured to hold a circumferential edge of the substrate disposed on the placement table. The control unit performs the detection process several times while the detection position of the substrate is changed from a first detection position corresponding to one holder to a second detection position corresponding to another holder next to the one holder, and when the accumulated value is smaller than the predetermined value, the control unit determines that the holding state of the substrate is abnormal.

In the substrate processing apparatus as described above, the control unit performs the detection process before the substrate is processed and performs the determination process after the substrate is processed.

An yet another exemplary embodiment of the present disclosure provides a substrate processing method of processing a substrate, including: holding the substrate disposed on a placement table by a holder; irradiating light on the surface of the substrate on the holder; detecting a light amount reflected from the surface of the substrate by a detector; performing the detecting at a plurality of positions of the substrate, accumulating the detection values of the light amount detected by the detector and determining that the holding state of the substrate is abnormal when the accumulated value is smaller than a predetermined value.

In the substrate processing method as described above, the determining determines that the holding state of the substrate is abnormal, when the detecting is performed several times, and the detection values are accumulated as analog data, if the accumulated value is smaller than the predetermined value.

In the substrate processing method as described above, a plurality of holders are installed at regular intervals along an outer circumference of the substrate to hold a circumferential edge of the substrate, the determining determines that the holding state of the substrate is abnormal when the detecting is performed several times while the detection position of the substrate is changed from a first detection position corresponding to one holder to a second detection position corresponding to another holder next to the one holder, if the accumulated value is smaller than the predetermined value.

In the substrate processing method as described above, the determining is performed before the substrate is processed, and the determining is preformed after the substrate is processed.

According to the exemplary embodiments of the present disclosure, it is possible to exactly detect a holding state of a substrate without being affected by, for example, a kind of layers formed on the substrate, a surface state, and a detection position of the substrate.

Hereinafter, the exemplary embodiments of the present disclosure will be described with reference to the accompanying drawings. Here, a case where the present disclosure is applied to a substrate processing apparatus that cleans the surface of a semiconductor wafer (hereinafter, simply referred to as "a wafer") will be described.

Exemplary Embodiment

First, a schematic configuration of a substrate processing apparatus according to an exemplary embodiment of the present disclosure will be described with reference to FIG. 1.

FIG. 1 is a plan view illustrating a schematic configuration of a substrate processing apparatus according to an exemplary embodiment of the present disclosure.

A substrate processing apparatus 10 includes a carrying-in/out station (a substrate carrying-in/out unit) 1 in which wafer carriers WC accommodating a plurality of wafers W are disposed and which carries-in/out wafer W, and a processing station (a liquid processing unit) 2 for performing a cleaning process on wafer W. Carrying-in/out station (substrate carrying-in/out unit) 1 is installed adjacent to processing station (liquid processing unit) 2.

Carrying-in/out station 1 includes a carrier disposing unit 11, a transport unit 12, a transfer unit 13 and a housing 14. In carrier disposing unit 11, four wafer carriers WC accommodating the plurality of wafers W in a horizontal state are disposed. Transport unit 12 transports wafer W. Transfer unit 13 transfers wafer W. Housing 14 accommodates transport unit 12 and transfer unit 13.

Transport unit 12 includes a transport mechanism 15. Transport mechanism 15 includes a wafer holding arm 15a that holds wafer W and a mechanism that moves wafer holding arm 15a forward and backward. Transport mechanism 15 further includes a mechanism that moves wafer holding arm 15a along a horizontal guide 17 extending in an X direction where wafer carriers WC are arranged, a mechanism that moves wafer holding arm 15a along a vertical guide (not illustrated) installed in a vertical direction and a mechanism that rotates wafer holding arm 15a in a horizontal surface. Wafer W is transported between wafer carrier WC and transfer unit 13 by transport mechanism 15.

Transfer unit 13 includes a transfer rack 20 including a plurality of disposition parts on which wafer W can be disposed, on a transfer stage 19. Transfer unit 13 is configured such that wafer W is transferred between transfer unit 13 and processing station 2 through transfer rack 20.

Processing station 2 has a housing 21 which is formed in a rectangular parallelepiped shape. Processing station 2 includes a transport chamber 21a and two unit chambers 21b and 21c in housing 21. Transport chamber 21a forms a transport path extending along a Y direction perpendicular to the X direction where wafer carriers WC are arranged, at the center of housing 21. Two unit chambers 21b and 21c are installed at both sides of transport chamber 21a. Six liquid processing units 22 in each of unit chambers 21b and 21c, that is, a total of twelve liquid processing units 22 are horizontally arranged along transport chamber 21a.

A transport mechanism 24 is installed within transport chamber 21a. Transport mechanism 24 includes a mechanism that moves wafer holding arm 24a holding wafer W forward and backward. Transport mechanism 24 further includes a mechanism that moves wafer holding arm 24a in the Y direction along a horizontal guide 25 installed in transport chamber 21a, a mechanism that moves wafer holding arm 24a along a vertical guide (not illustrated) installed in a vertical direction, and a mechanism that rotates wafer holding arm 24a in a horizontal surface. By transport mechanism 24, wafer W is carried-in/out into/from each of liquid processing units 22.

Next, a liquid processing unit 22 mounted on the substrate processing apparatus according to the exemplary embodiment of the present disclosure will be described.

Figure 2:
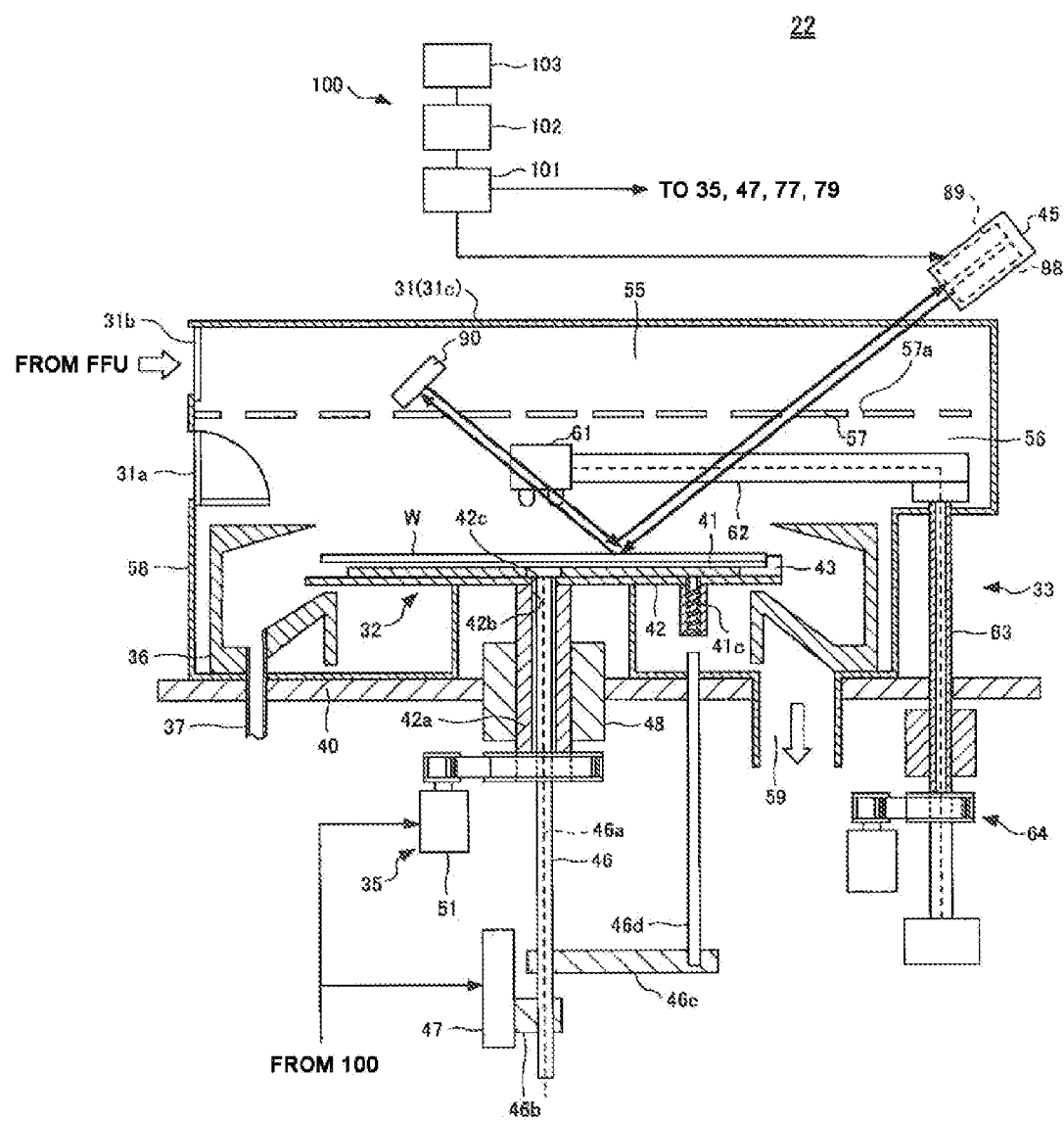
FIG. 2 is a longitudinal cross-sectional view of a liquid processing unit.

FIG. 2 is a longitudinal sectional view of liquid processing unit 22.

Liquid processing unit 22 includes a casing 31, a substrate holding mechanism 32 that is installed within casing 31 and holds wafer W, a processing liquid supply mechanism 33 that supplies a processing liquid to wafer W held by substrate holding mechanism 32 and a rotation mechanism 35 (a motor 51) that rotates substrate holding mechanism 32.

Substrate holding mechanism 32 holds wafer W as wafer W is disposed thereon, and corresponds to a placement table in the present disclosure. Clamp members 43 correspond to holders in the present disclosure. Rotation mechanism 35 corresponds to a rotation unit in the present disclosure.

Within casing 31, an annular liquid discharge cup 36 is disposed outside a circumferential edge of substrate holding mechanism 32 to receive a processing liquid after wafer W is cleaned. A liquid discharge pipe 37, which discharges a processing liquid flowing via liquid discharge cup 36, is connected to liquid discharge cup 36. An entrance 31a is formed at a side wall of casing 31 to allow wafer W to move into or out of casing 31.

Casing 31 corresponds to a housing in the present disclosure.

Substrate holding mechanism 32 includes a lift pin plate 41, a holding plate 42, and clamp members 43. Lift pin plate 41 and holding plate 42 are horizontally installed and formed in a disk shape. Clamp members 43 are installed at a circumferential edge of holding plate 42 to hold a circumferential edge of wafer W. The detailed structures of lift pin plate 41, holding plate 42 and clamp members 43 will be described below.

A cylindrical rotation shaft 42a vertically extending downward is connected to a central portion of a bottom surface of holding plate 42. A circular hole 42c communicating with a hole 42b of cylindrical rotation shaft 42a is formed in the central portion of holding plate 42, and a cleaning liquid supply pipe 46 is installed in hole 42b of rotation shaft 42a. A rear surface processing liquid supply line 46a is formed within cleaning liquid supply pipe 46 to supply a processing liquid toward a rear surface (bottom surface) of wafer W.

Cleaning liquid supply pipe 46 is connected to an elevation mechanism 47 through a first member 46b and is installed to be elevatable in a vertical direction.

A second member 46c is connected to cleaning liquid supply pipe 46. Three rod-shaped third members 46d are connected to second member 46c to extend upward from second member 46c. Third members 46d are installed correspondingly to respective connection members 41c extending downward from a rear surface of lift pin plate 41, which will be described below. When cleaning liquid supply pipe 46 is moved upward by elevation member 47, third members 46d can push up connection members 41c upward.

Rotation shaft 42a is rotatably supported on a base plate 40 through a bearing member 48 and is rotated by rotation mechanism 35.

A gas introducing part 55 is formed in an upper portion of the inside of casing 31 to introduce a gas from a fan filter unit (FFU) (not illustrated) of the substrate processing apparatus through an inlet port 31b. Clean air (gas) introduced through inlet port 31b is supplied to a space above wafer W which is held by substrate holding mechanism 32.

A partitioning member 57 is installed between gas introducing part 55 and a processing space 56 within casing 31, in which, for example, substrate holding mechanism 32 is installed. Partitioning member 57 has hole parts 57a to allow a gas to flow from gas introducing part 55 to processing space 56 and allow a laser beam to pass through between a laser sensor 45, which will be described below, and wafer W.

An annular gas discharge cup 58 is disposed outside a circumferential edge of liquid discharge cup 36 to receive and discharge clean air which is supplied from gas introducing part 55 to flow along the surface of wafer W. A gas discharge pipe 59 is connected to gas discharge cup 58 to discharge a gas passing through gas discharge cup 58.

Figure 3:
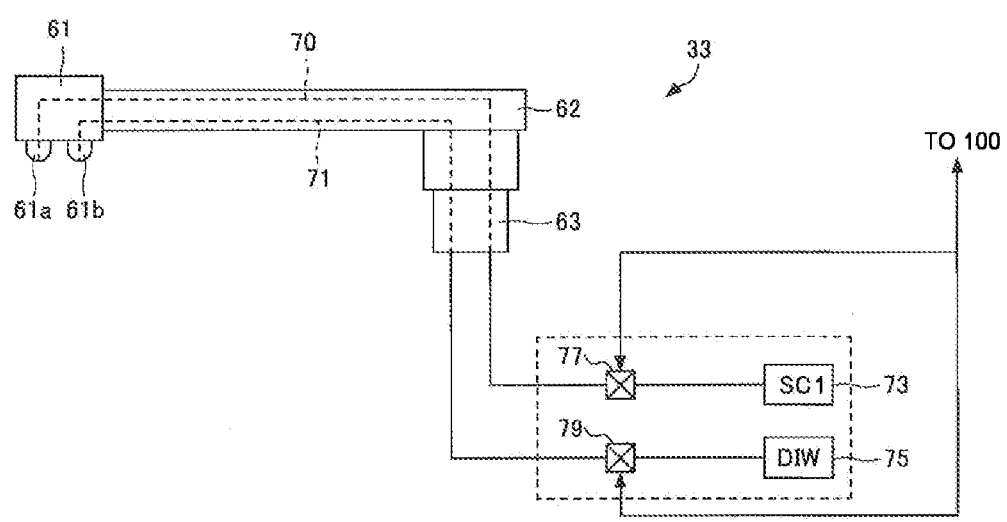
FIG. 3 is a schematic diagram illustrating the configuration of a processing liquid supply mechanism of the liquid processing unit.

FIG. 3 is a schematic diagram illustrating the configuration of processing liquid supply mechanism 33 of liquid processing unit 22.

As illustrated in FIGS. 2 and 3, processing liquid supply mechanism 33 includes a nozzle block 61 having nozzles 61a and 61b which supply a processing liquid to the surface of wafer W held by substrate holding mechanism 32. Processing liquid supply mechanism 33 further includes a nozzle arm 62 and a nozzle pivot shaft 63. Nozzle arm 62 is connected to nozzle block 61 and moves nozzle block 61 along the surface of wafer W held by substrate holding mechanism 32. Nozzle pivot shaft 63 extends from nozzle arm 62 downward in a vertical direction. Processing liquid supply mechanism 33 further includes a nozzle driving mechanism 64 which drives nozzle pivot shaft 63.

A processing liquid line 70 through which a processing liquid passes, and a rinse liquid line 71 through which a rinse liquid passes are formed within nozzle block 61 having nozzles 61a and 61b, nozzle arm 62 and nozzle pivot shaft 63 of processing liquid supply mechanism 33.

Processing liquid line 70 communicates with an SC1 supply source 73 that supplies a mixture of ammonium hydroxide, hydrogen peroxide and DI water (SC1) through a first valve 77. Rinse liquid line 71 communicates with a DIW supply source 75 that supplies deionized water (DIW) through a second valve 79.

A mechanism supplying a processing liquid to rear surface processing liquid supply line 46a includes the same configuration as that of processing liquid supply mechanism 33 described above.

Each of first valve 77 and second valve 79 is connected with a control unit 100 and controlled by control unit 100.

In addition to SC1, for example, diluted hydrofluoric acid (DHF), buffered hydrofluoric acid (BHF) (a mixture of HF and $NH_4F$) and LAL (a mixture of BHF and a surfactant) may be supplied. As a drying solvent, for example, isopropyl alcohol (IPA) may be supplied.

Figure 4:
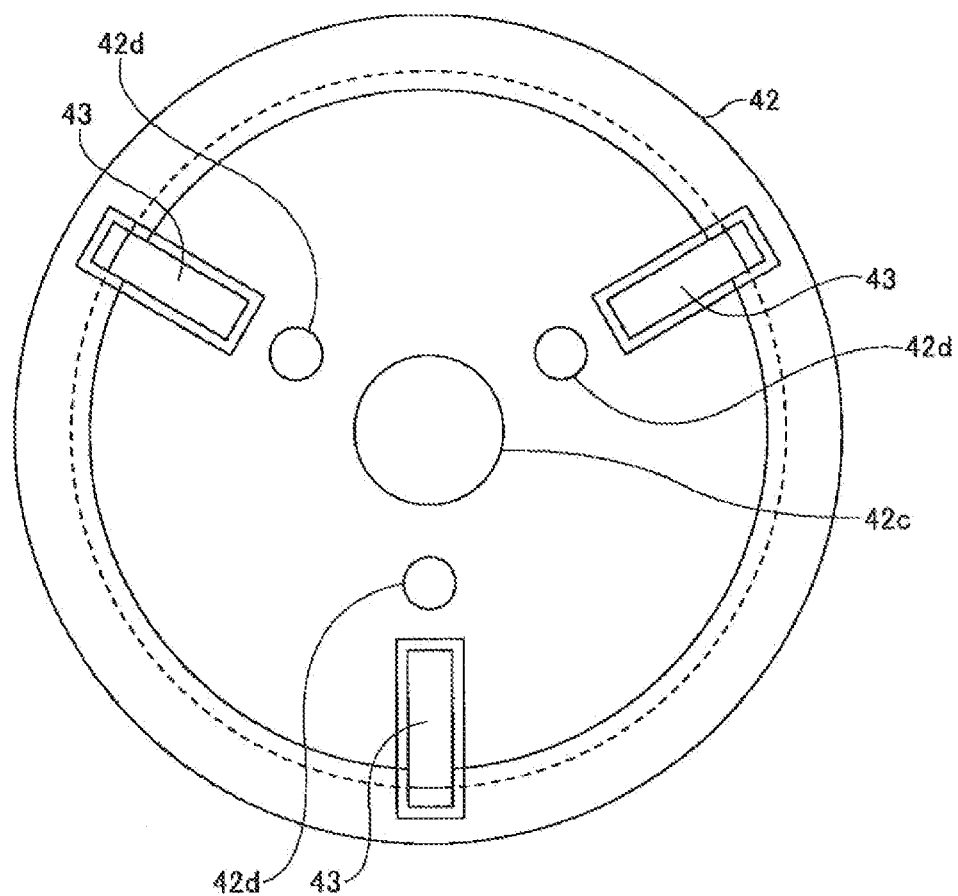
FIG. 4 is a plan view illustrating the configuration of a holding plate and clamp members.
Figure 5:
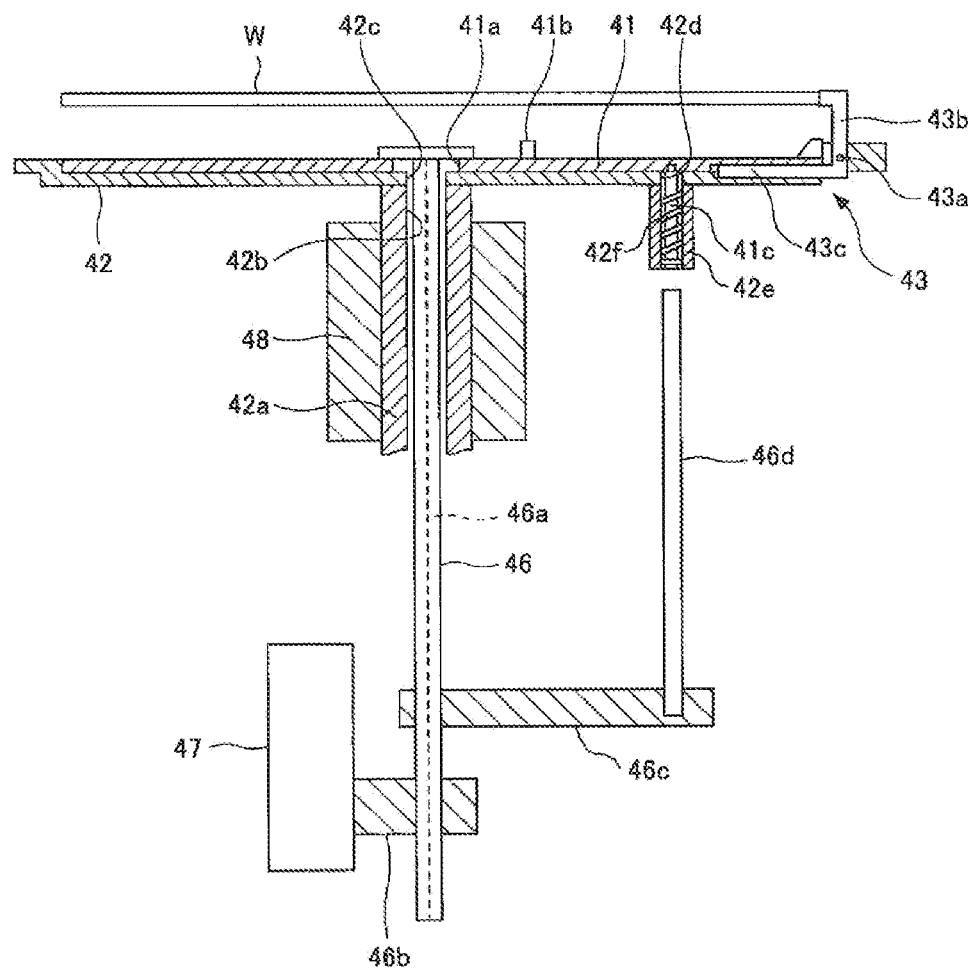
FIG. 5 is a longitudinal cross-sectional view illustrating the configuration of a substrate holding mechanism of a liquid processing unit when a lift pin plate and a cleaning liquid supply pipe are situated at a lower location.
Figure 6:
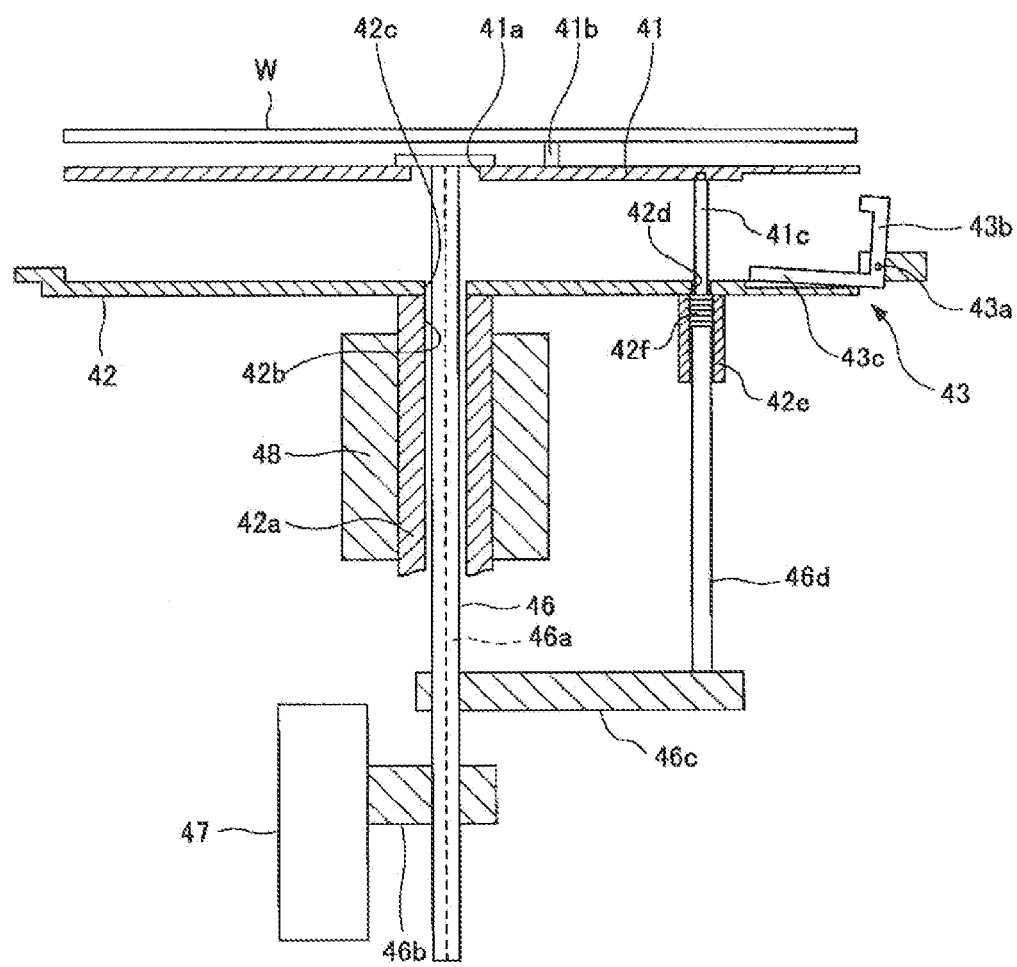
FIG. 6 is a longitudinal sectional view illustrating the configuration of the substrate holding mechanism of the liquid processing unit when the lift pin plate and the cleaning liquid supply pipe are situated at an upper location.

FIG. 4 is a plan view illustrating the configuration of holding plate 42 and clamp members 43. FIGS. 5 and 6 are longitudinal cross-sectional views illustrating the configuration of substrate holding mechanism 32 of liquid processing unit 22 when lift pin plate 41 and cleaning liquid supply pipe 46 are situated at lower location or upper location, respectively.

As illustrated in FIG. 4, a plurality of clamp members 43, which are disposed at different locations along the circumferential direction, are installed near a circumferential edge of holding plate 42. In the present exemplary embodiment, for example, three clamp members 43 are installed at regular intervals in a circumferential direction of wafer W held on holding plate 42.

Lift pin plate 41 is formed in a disk shape and has a through-hole 41a at the central portion thereof. Cleaning liquid supply pipe 46 passes through through-hole 41a. Three lift pins 41b are installed on the surface of lift pin plate 41. Lift pins 41b are formed at regular intervals in a circumferential direction between the central portion and circumferential edge of lift pin plate 41. Three rod-shaped connection members 41c extending downward are installed on the rear surface of lift pin plate 41. Connection members 41c are installed at regular intervals in a circumferential direction between the central portion and circumferential edge of lift pin plate 41.

Three through-holes 42d, through which each of connection members 41c passes, are formed in holding plate 42. Through-holes 42d are installed at regular intervals in a circumferential direction of holding plate 42. Three cylindrical accommodating members 42e are installed at points of through-holes 42d on a rear surface of holding plate 42 and extend downward from the rear surface of holding plate 42. Each of accommodating members 42e accommodates each of connection members 41c. Accommodating members 42e are installed at regular intervals in a circumferential direction near the circumferential edge of holding plate 42.

An inner diameter of each of cylindrical accommodating members 42e is slightly larger than an outer diameter of each of connection members 41c, and each of connection members 41c is movable within each of accommodating members 42e along a longitudinal direction of each of accommodating members 42e (an up/down direction in FIGS. 5 and 6). As illustrated in FIG. 5, when lift pin plate 41 is situated at the lower location, each of connection members 41c is accommodated in each of accommodating members 42e. By doing this, when holding plate 42 is rotated, lift pin plate 41 is also rotated in conjunction with rotation of holding plate 42 through each of connection members 41c. Meanwhile, as illustrated in FIG. 6, when lift pin plate 41 is situated at the upper location, only a part of a lower portion of each of connection members 41c is accommodated in each of accommodating members 42e, and each of connection members 41c passes through through-hole 42d and protrudes upward from holding plate 42.

A spring 42f is accommodated in a compressed state in a hollow portion of each of accommodating members 42e. Downward force (force moving downward from holding plate 42) is applied to connection members 41c at all times by force returning spring 42f from the compressed state to an original state.

Clamp members 43 are installed on holding plate 42 to clamp wafer W from the lateral side. Clamp members 43 hold wafer W from the lateral side when lift pin plate 41 is situated at the lower location as illustrated in FIG. 5, while clamp members 43 are spaced apart from wafer W when lift pin plate 41 is situated at the upper location as illustrated in FIG. 6.

Each of clamp members 43 includes a holding member 43b holding wafer W from the lateral side and a pressed member 43c installed at an opposite side to holding member 43b with respect to a shaft 43a and rotates about shaft 43a which is pivotally supported at holding plate 42.

When lift pin plate 41 is moved from the upper location to the lower location, each of clamp members 43 rotates about shaft 43a as pressed member 43c is pressed downward by the rear surface of lift pin plate 41. As each of clamp members 43 rotates about shaft 43a, holding member 43b moves toward wafer W from the lateral side of wafer W and advances to wafer W. By doing this, as illustrated in FIG. 5, when lift pin plate 41 reaches the lower location, wafer W is held from the lateral side by clamp members 43. As illustrated in FIG. 5, when wafer W is held from the lateral side by clamp members 43, wafer W is spaced apart from tip ends of lift pins 41b upward and floats above lift pins 41b.

Clamp members 43 are not limited to a case where clamp members 43 are installed to be rotatable about shaft 43a, as long as clamp members 43 are installed to be able to advance to and retreat from wafer W and hold the circumferential edge of wafer W as clamp members 43 advance to wafer W.

Next, laser sensor 45 will be described. Laser sensor 45 is, for example, a reflective laser sensor and includes a light source 88 and a light receiving element 89. Light receiving element 89 corresponds to a detector in the present disclosure.

Figure 7:
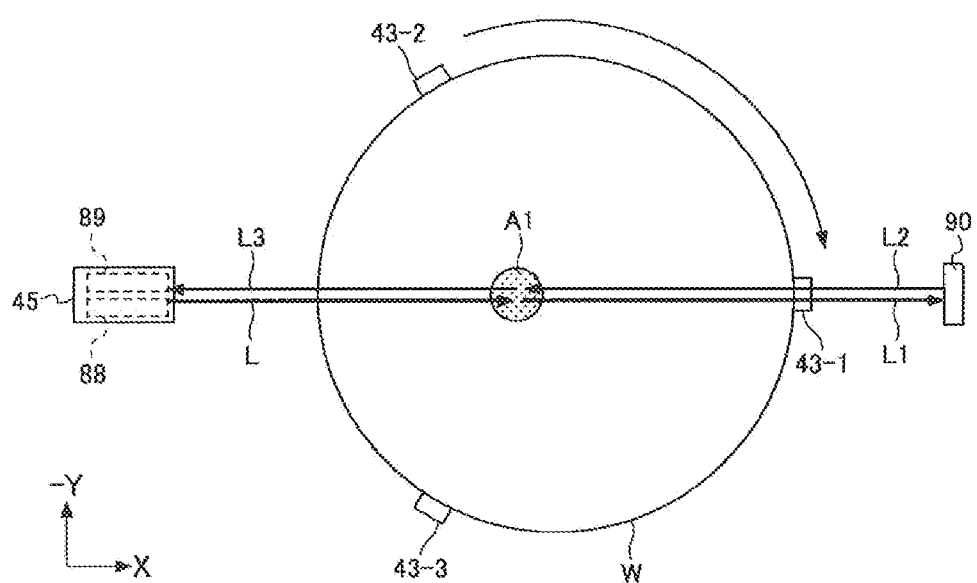
FIG. 7 is a plan view schematically illustrating a disposition relationship of a laser sensor, a wafer, and a mirror member.
Figure 8:
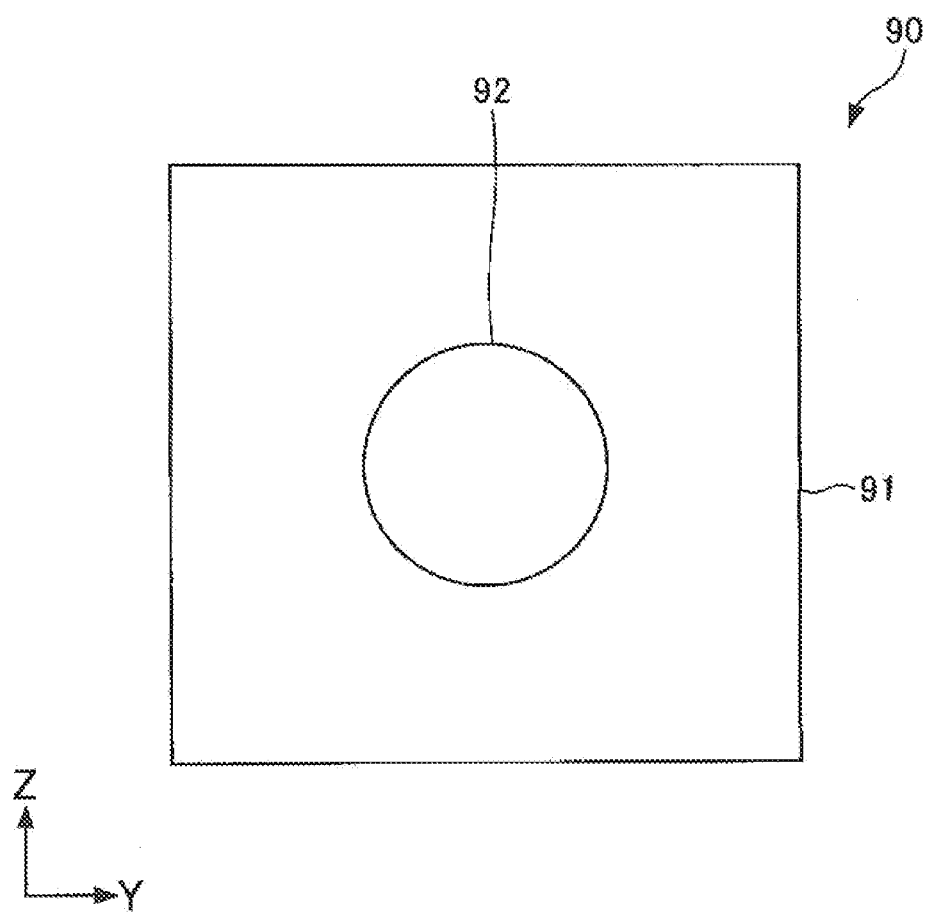
FIG. 8 is a view illustrating the configuration of a mirror member when viewed along the axis of light.

FIG. 7 is a plan view schematically illustrating a disposition relationship between laser sensor 45, wafer W and a mirror member 90. FIG. 8 is a view illustrating the configuration of mirror member 90 when viewed along the axis of light L1.

Light source 88 irradiates light to an area A1 except for the center of wafer W on the surface of wafer W held by clamp members 43. Examples of light source 88 may include, for example, a laser emitting a laser beam such as, for example, a red laser beam and a light emitting diode (LED). In the present exemplary embodiment, the laser beam is irradiated to the top surface of wafer W, but light may be irradiated to and reflected from the surface of wafer W or light may be irradiated to a circumferential lateral surface or bottom surface of wafer W.

Light receiving element 89 detects a light amount of light reflected from the surface of wafer W. Examples of light receiving element 89 may include, for example, a photodiode, and a phototransistor.

Light source 88 and light receiving element 89 may be separately installed, and light source 88 may be installed at a different location from that of light receiving element 89.

As illustrated in FIGS. 2 and 7, when light source 88 and light receiving element 89 are integrally installed, a mirror member 90 may also be installed. Mirror member 90 is disposed to form an optical path as follows. In other words, mirror member 90 is installed on the optical path of reflected light L1 of light L irradiated to area A1 of the top surface of wafer W from light source 88. When light L1 is incident on mirror member 90, incident light L1 is reflected from mirror member 90, and reflected light L2 is irradiated again to or near area A1 of the top surface of wafer W. Light L2 irradiated to or near area A1 of the top surface of wafer W is reflected from or near area A1 of the top surface of wafer W, and reflected light L3 is received in light receiving element 89.

As illustrated in FIG. 8, mirror member 90 includes a reflecting part 92 reflecting light which is installed at a central portion of a non-reflecting part 91 not reflecting light. For example, reflecting part 92 may have various configurations such as, for example, a matter formed by hollowing out the central portion of non-reflecting part 91 and attaching a metallic plate to the hollowed portion, or a matter formed by depositing a metallic film on the central portion of non-reflecting part 91.

Laser sensor 45 is installed outside casing 31. In this case, casing 31 at least partially includes a transmissive member 31c that transmits the light which is reflected from the top surface of wafer W. Casing 31, transmissive member 31c and laser sensor 45 are disposed such that a laser beam from light source 88 of laser sensor 45 passes through transmissive member 31c to be irradiated to the top surface of wafer W, and the light reflected from the top surface of wafer W passes through transmissive member 31c to be received in light receiving element 89 of laser sensor 45. From the viewpoint of transparency and resistance to various chemicals such as processing liquids, transmissive member 31c may be made of, for example, a resin such as polyvinyl chloride (PVC) or quartz glass.

Mirror member 90 may be installed outside casing 31 or, as illustrated in FIG. 2, may be installed at upper portion of partitioning member 57, that is, in gas introducing part 55.

Control unit 100 includes a process controller 101 including a microprocessor (computer), and is configured such that individual components of substrate processing apparatus 10 are connected to process controller 101 to be controlled by process controller 101. A user interface 102 including a keyboard that allows a process manager to input a command in order to manage individual components of substrate processing apparatus 10 or a display that visualizes and displays the operation status of the individual components of substrate processing apparatus 10, is connected to process controller 101. Process controller 101 is connected with a memory unit 103 in which a control program that implements various types of processing performed in substrate processing apparatus 10 by the control of process controller 101, or a control program that allows individual components of substrate processing apparatus 10 to perform a predetermined processing based on processing conditions, that is, a recipe is stored. The recipe is stored in a central storage medium in memory unit 103. The storage medium may be a hard disk or a semiconductor memory. The receipt may be appropriately transmitted from other device through, for example, a dedicated line.

If necessary, any recipe is called from memory unit 103 in response to a command from user interface 102 to be executed by process controller 101. Therefore, under the control of process controller 101, individual members including motor 51, elevation mechanism 47, laser sensor 45 and processing liquid supply mechanism 33 are controlled, and desired processing is performed in substrate processing apparatus 10.

Figure 9:
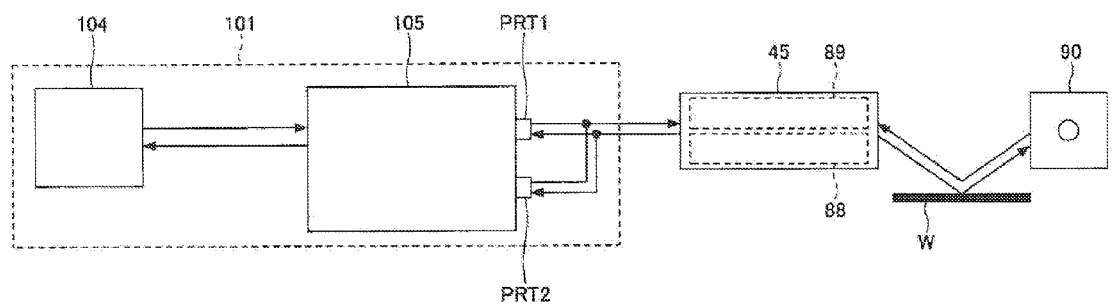
FIG. 9 is a view illustrating the configuration of a control system in which a process controller controls a laser sensor.

FIG. 9 is a view illustrating the configuration of a control system in which process controller 101 controls laser sensor 45.

Process controller 101 includes, for example, a microcontroller 104 and an I/O board 105. Microcontroller 104 inputs a control signal to light source 88 of laser sensor 45 through I/O board 105. Light source 88 to which the control signal is input irradiates light on wafer W. The light irradiated to wafer W is reflected from the top surface of wafer W, mirror member 90, and the top surface of wafer W again, and the reflected light is detected at light receiving element 89. The light detected at light receiving element 89 is amplified by, for example, an amplifier installed in laser sensor 45 and becomes a detection signal. The detection signal is input to microcontroller 104 through I/O board 105. Microcontroller 104 determines whether the holding state of wafer W is normal or not based on the input detection signal.

I/O board 105 may have a port PRT2 that inputs and outputs an analog signal in addition to a port PRT1 that inputs and outputs a digital signal.

Next, a first exemplary embodiment of a substrate processing method which is performed using liquid processing unit 22 by control unit 100 will be described.

Figure 10:
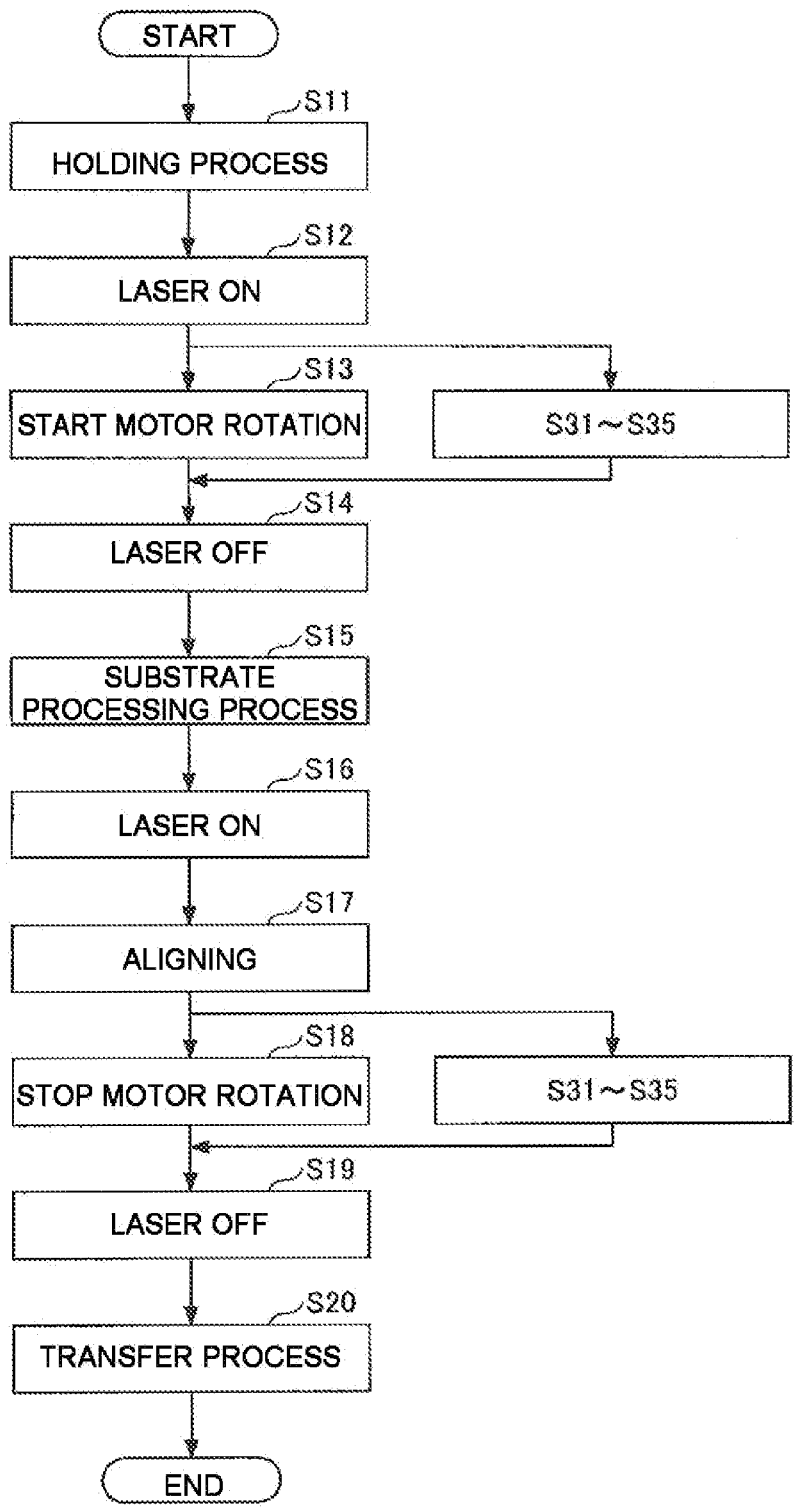
FIG. 10 is a flowchart illustrating an order of processes in a substrate processing method using the substrate processing apparatus according to the exemplary embodiment of the present disclosure.
Figure 11:
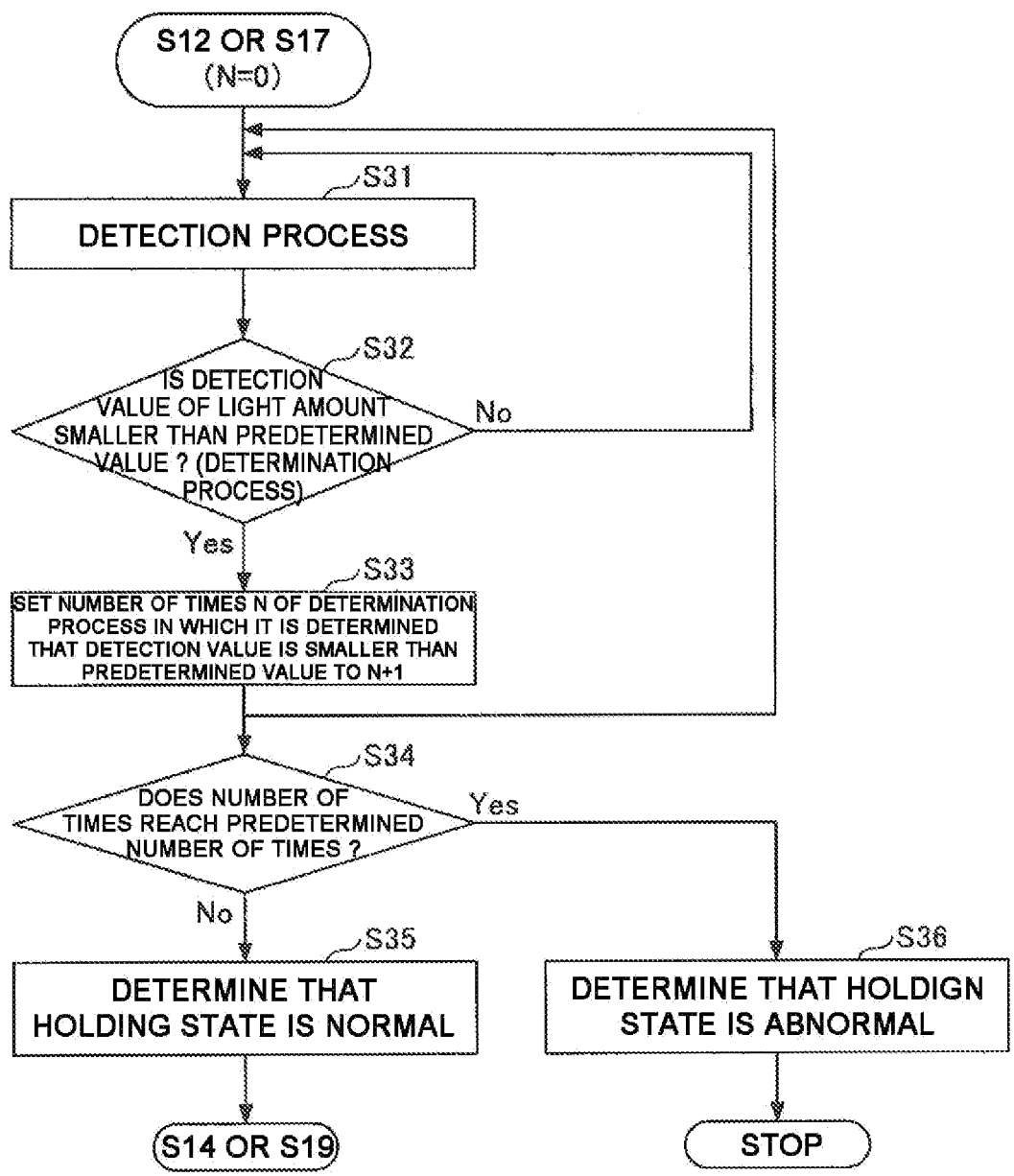
FIG. 11 is a flowchart illustrating an order of processes in a substrate processing method using a substrate processing apparatus according to a first exemplary embodiment of the present disclosure.

FIGS. 10 and 11 are flowcharts illustrating an order of respective processes in a substrate processing method using the substrate processing apparatus according to the present exemplary embodiment.

Wafer W is taken out from wafer carrier WC disposed in advance on carrier disposing unit 11 of carrying-in/out station 1 and disposed on a disposition part of transfer rack 20 by transport mechanism 15. This operation is consecutively performed.

At step S11, wafer W disposed on the disposition part of transfer rack 20 is sequentially transported and carried in any one of liquid processing units 22 by transport mechanism 24 of processing station 2. In liquid processing unit 22, wafer holding arm 24a advances into the inside of casing 31 from the outside of casing 31 through entrance 31a. While wafer holding arm 24a advances to the inside of casing 31, lift pin plate 41 is moved from the lower location to the upper location by elevation mechanism 47, and wafer W is transferred from wafer holding arm 24a to lift pins 41b of lift pin plate 41. While wafer W is transferred to lift pins 41b, wafer holding arm 24a is retreated from the inside of casing 31 to the outside through entrance 31a and lift pin plate 41 is moved from the upper location to the lower location by elevation mechanism 47. When lift pin plate 41 is moved to the lower location, pressed members 43c are pressed downward by the bottom surface of lift pin plate 41 and clamp members 43 rotate about shafts 43a, respectively, and thus wafer W is held from the lateral side by clamp members 43 (holding process).

Subsequently, at step S12, a laser beam L is emitted from light source 88 of laser sensor 45 (laser on). The emitted laser beam L is irradiated to area A1 except for the center of wafer W on the top surface of wafer W through transmissive member 31c of casing 31. Thereafter, at step S13, while wafer W held by clamp members 43 is rotated (starting motor rotation) together with clamp members 43 about the center of holding plate 42 as a rotation axis by motor 51, steps S31 to S35 illustrated in FIG. 11 are performed.

At step S31, the light irradiated to wafer W is reflected from the top surface of wafer W, mirror member 90 and the top surface of wafer W again, and the light amount of reflected light L3 is detected by light receiving element 89 of laser sensor 45 (detection process). Thereafter, at step S32, it is determined whether a detection value of the light amount is smaller than a predetermined value (determination process).

The predetermined value is determined in advance before performing processing. Specifically, for example, the predetermined value may be determined as follows. A detection value (a detection value in a normal case) detected by laser sensor 45 when the holding state of wafer W is normal and a detection value (a detection value in an abnormal case) detected by laser sensor 45 when the holding state of wafer W is abnormal are detected in advance. Thereafter, the predetermined value is determined to be smaller than a minimum value of the detection value in the normal case.

Figure 12:
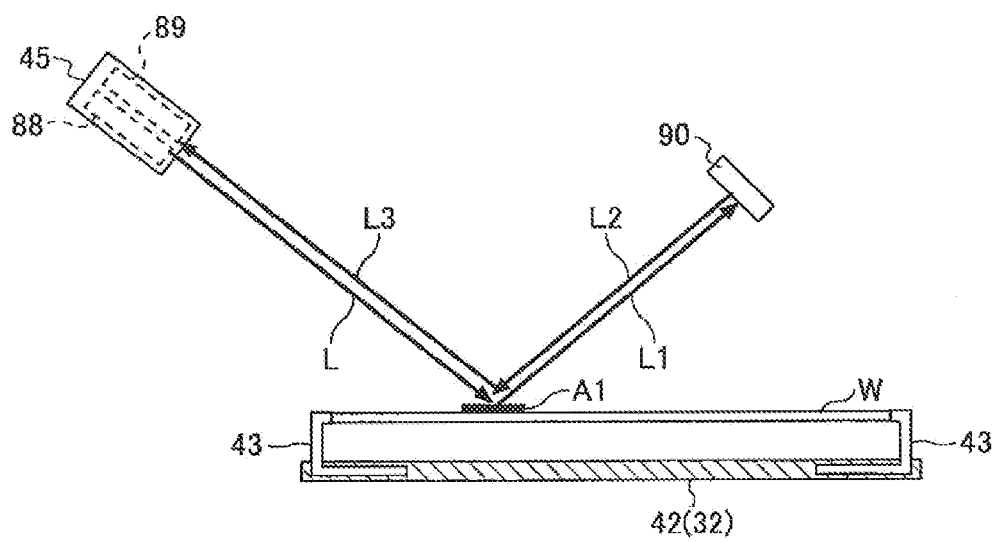
FIG. 12 is a first diagram illustrating when a holding state of a wafer is normal.
Figure 13:
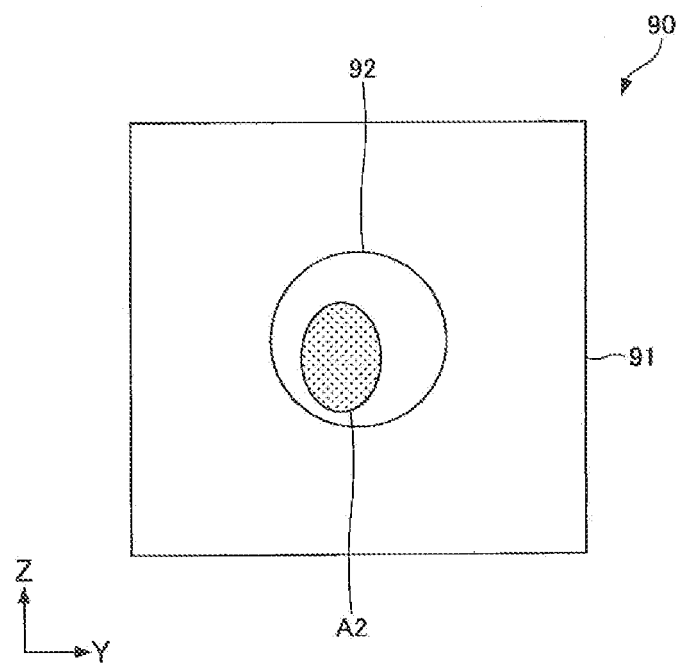
FIG. 13 is a second diagram illustrating when the holding state of the wafer is normal.

As illustrated in FIGS. 12 and 13, when wafer W is held at a predetermined location, that is, when the holding state of wafer W is normal, laser beam L from laser sensor 45 is reflected from area A1 of the top surface of wafer W and reflected light L1 is incident to an area A2 of reflecting part 92 of mirror member 90. When light L1 is incident to area A2, incident light L1 is reflected from area A2, and reflected light L2 is irradiated again to or near area A1 of the top surface of wafer W. Light L2 irradiated to or near area A1 of the top surface of wafer W is reflected from or near area A1 of the top surface of wafer W, and reflected light L3 is received in light receiving element 89, thereby detecting the light amount of light reflected from the top surface of wafer W. In this case, the detection value of the light amount detected by light receiving element 89 of laser sensor 45 is relatively large.

Figure 14:
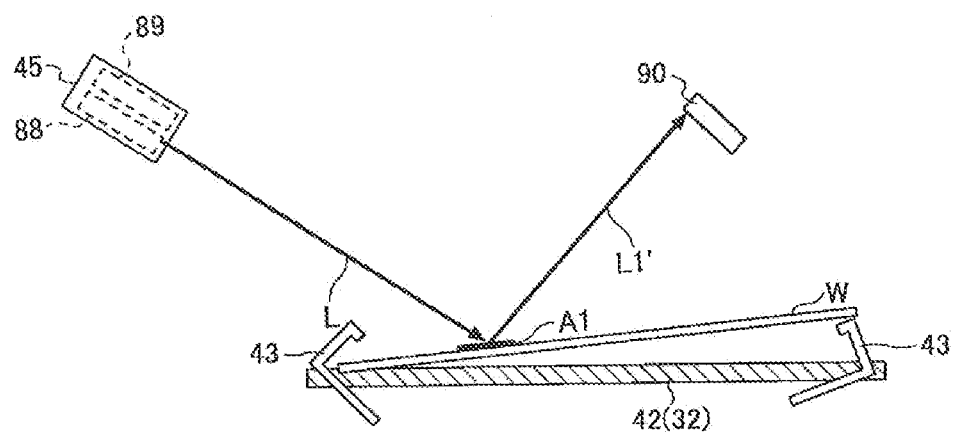
FIG. 14 is a first diagram illustrating when a holding state of a wafer is abnormal.
Figure 15:
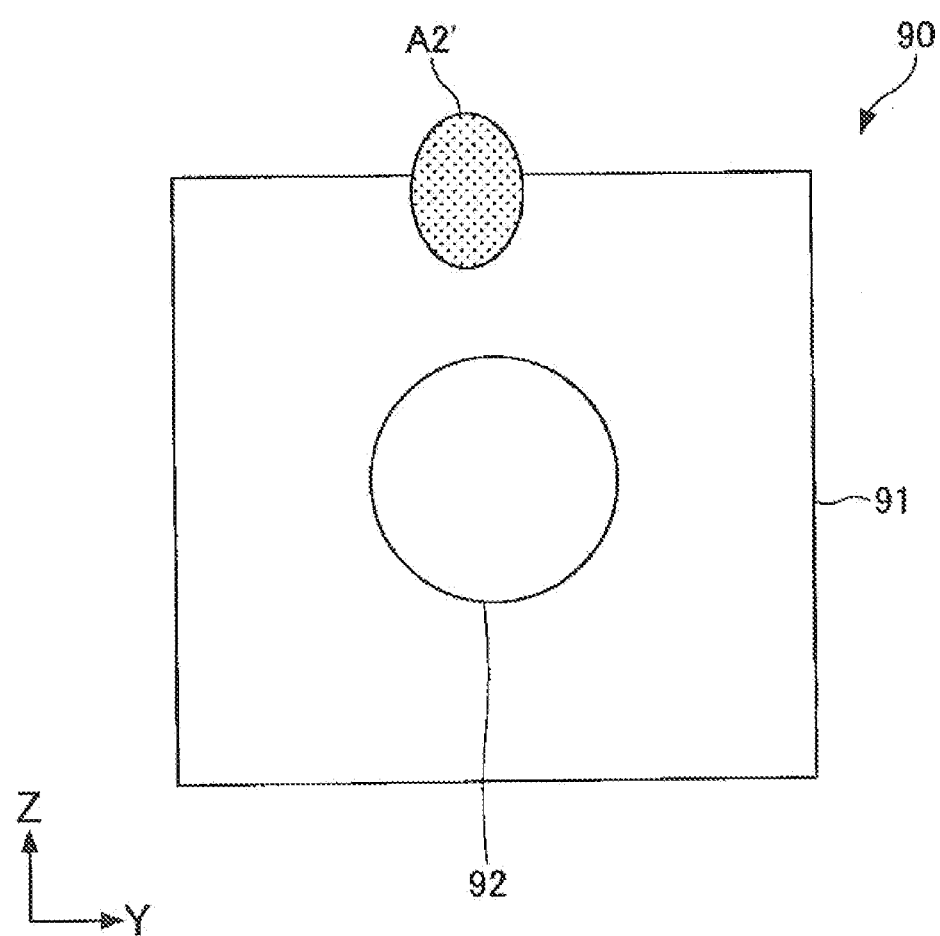
FIG. 15 is a second diagram illustrating when the holding state of the wafer is abnormal.

Meanwhile, as illustrated in FIGS. 14 and 15, it is assumed that wafer W is not held at the predetermined location, for example, wafer W is placed on clamp members 43, that is, the holding state of wafer W is abnormal. Laser beam L from laser sensor 45 is irradiated to area A1 of the top surface of wafer W which is placed on clamp members 43. Laser beam L irradiated to area A1 is reflected from area A1. However, when the holding state of wafer W is abnormal, wafer W is inclined from the horizontal surface, and as a result, an optical path of light L1' reflected from area A1 is different from that of light L1 illustrated in FIG. 12. Accordingly, reflected light L1' is irradiated to an area A2' which is other than reflecting part 92 of mirror member 90, or around mirror member 90. A ratio of the light which is reflected from or near area A1 of the top surface of wafer W and returns to light receiving element 89 to light L1' irradiated to area A2' is reduced almost close to zero. Therefore, the detection value of the light amount detected by light receiving element 89 of laser sensor 45 is relatively small.

Before performing step S31, a number of times parameter 'N', that is the total number of times of the determination process (determination processing) in which it is determined that the detected value is smaller than the predetermined value, is set to zero in advance. Thereafter, at step S32, when the detection value detected by light receiving element 89 is not smaller than the predetermined value, the number of times parameter remains 'N' as it is without adding 1 to the present value 'N', and step S31 (detection process) and step S32 (determination process) are performed again. Meanwhile, at step S32, when the detection value detected by light receiving element 89 is smaller than the predetermined value, the number of times parameter is set to 'N+1' by adding 1 to the present value 'N', and step S31 (detection process) and step S32 (determination process) are performed again.

At step S13, since wafer W rotates about the center of holding plate 42 as the rotation axis, control unit 100 consecutively performs step S31 (detection process) while changing the detection position on wafer W. A plurality of detection values are arbitrarily extracted from the detection values consecutively detected and compared and determined with the predetermined value. Step S31 (detection process) and step S32 (determination process) may be performed several times while changing the detection position randomly or at predetermined intervals without consecutively changing the detection position by inserting a standby time (pause) when the process returns to step S31 (detection process) from step S32 (determination process).

In this way, after performing the step S31 (detection process) and step S32 (determination process) several times, step S34 is performed. At step S34, it is determined whether the number of times parameter 'N', that is the total number of times of determination processes (determination processing) in which it is determined that the detection value is smaller than the predetermined value, reaches the predetermined number of times. The predetermined number of times of the number of times parameter 'N' is previously determined based on the detection values in the normal case and the abnormal case before the processing starts. When the number of times parameter 'N' does not reach the predetermined number of times, it is determined that the holding state of wafer W is normal (step S35), and the process proceeds to step S14.

Meanwhile, when the number of times parameter 'N' reaches the predetermined number of times, it is determined that the holding state of wafer W is abnormal (step S36) and the processing stops. Alternatively, instead of stopping the processing, wafer W may be held by clamp members 43 again. In other words, pressed member 43c pressed downward by the bottom surface of lift pin plate 41 is released by moving lift pin plate 41 from the lower location to the upper location by elevation mechanism 47, and wafer W held by clamp members 43 is released by rotating clamp members 43 about shaft 43a (see FIG. 6). Thereafter, pressed member 43c may be pressed downward by the bottom surface of lift pin plate 41 by moving lift pin plate 41 to the lower location again, and wafer W may be held again from the lateral side by holding members 43b of clamp members 43 by rotating clamp members 43 about shaft 43a (see FIG. 5). In other words, when it is determined that the holding state of wafer W is abnormal, wafer W may be held again by retreating and advancing holding members 43b of clamp members 43 from and to wafer W.

The procedure may return to step S31 from step S33 through step S34 each time. By doing this, when the holding state of wafer W is abnormal, even though all the determination processes (determination processing) having the plural number of times which is determined in advance are not performed, it may be determined that wafer W is abnormal at the time when the number of times parameter 'N' reaches the predetermined number of times.

At step S33, only when it is determined that the detection value is smaller than the predetermined value in the determination process (determination processing) before one time, the number of times parameter may be set to 'N+1' by adding 1 to the present value 'N'. In this case, at step S34, when the determination process (determination processing) is performed several times, if the determination process is consecutively performed by the predetermined number of times, and thus it is determined that the detection value is smaller than the predetermined value, it may be determined that the holding state of wafer W is abnormal. Therefore, since the effect such as a detection error of light receiving element 89 may be eliminated, the holding state of wafer W may be more exactly detected.

Figure 16:
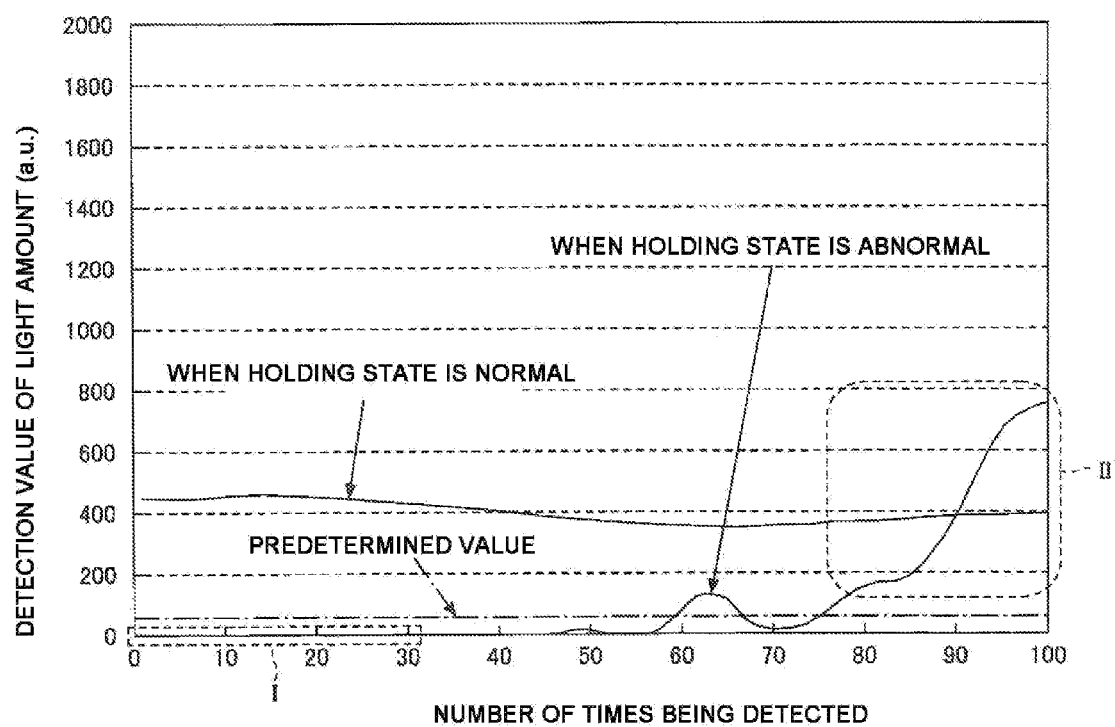
FIG. 16 is a graph schematically illustrating an example of a relationship between the number of times being detected and a detection value of light amount.

FIG. 16 is a graph schematically illustrating an example of a relationship between the number of times being detected and a detected value of light amount.

When the holding state of wafer W is normal, as illustrated in FIG. 16, a relatively large detection value is detected regardless of the number of times being detected, namely, the detection position. Meanwhile, when the holding state of wafer W is abnormal, as illustrated in FIG. 16, a relatively small detection value is detected.

However, for example, when the laser beam is reflected from the top surface of wafer W, the detection value of the light amount may be different from the assumed value by being affected by, for example, a kind of layers formed on wafer W, and a surface state of a layer processed on wafer W. When the detection position on wafer W is changed, the detection value may be significantly changed depending on the detection position by being affected by a surface state of a layer processed on wafer W.

Specifically, when the detection position on wafer W is changed, the detection value may be significantly changed depending on the detection position by the relationship between the clamp members 43 surmounted by wafer W and the detection position.

In the example illustrated in FIG. 16, when step S31 (detection process) and step S32 (determination process) are performed 100 times, the detection value of light amount is larger than the predetermined value in an area where the number of times being detected is 90 times or more (an area II surrounded by a dotted line in FIG. 16). This phenomenon may be observed when a direction toward clamp members 43 surmounted by wafer W from the center of wafer W is, for example, parallel with a direction of any one of lights L, L1, L2 and L3 when viewed from above. Meanwhile, as illustrated in an area I surrounded by a dotted line in FIG. 16, the detection value of the light amount is rarely larger than the predetermined value at detection positions except for the periphery of clamp members 43 surmounted by wafer W. In other words, in the example illustrated in FIG. 16, when the holding state of wafer W is abnormal, the number of times parameter 'N' reaches the predetermined number of times in area I, and thus it may be determined that the holding state of wafer W is abnormal regardless of whether the detection value of light amount is larger than the predetermined value in area II. Therefore, as illustrated in FIG. 7, the determination process (determination processing) is performed several times while the detection position on wafer W is changed. By doing this, it is possible to eliminate the effect of a variation in the light amount due to a direction where wafer W is placed on clamp members 43, thereby further preventing the holding state of wafer W from being erroneously detected.

When wafer W is placed on a clamp member 43-1 or a clamp member 43-2, the detection value is small at detection positions except for the periphery thereof. When wafer W is placed on a clamp member 43-3, the detection values between clamp member 43-1 and clamp member 43-2 are entirely small. Therefore, when the detection value is detected between two of the three clamp members, a point having the small detection value increases, and the number of times of determination that the detection value is smaller than the predetermined value increases, and thus it may be determined that the holding state of wafer W is abnormal. Accordingly, since the holding state of wafer W may be exactly detected without rotating wafer W over the entire circumference (360°), it is possible to improve the throughput.

In the present exemplary embodiment, for example, three clamp members 43 are installed at regular intervals, that is, every 120° along the circumferential direction of wafer W. Thus, wafer W may be rotated in a range of, for example, at least 120° from a first detection position corresponding to clamp member 43-1 to a second detection position corresponding to clamp member 43-2 next to clamp member 43-1.

In the example illustrated in FIG. 16, wafer W is rotated in the range of 120°, and in this case, step S31 (detection process) and step S32 (determination process) may be performed several times.

When it is determined at step S34 that the holding state of wafer W is normal (step S35), the process proceeds to step S14 illustrated in FIG. 10. At step S14, emission of laser beam L from light source 88 of laser sensor 45 stops (laser OFF), and then step S15 is performed. At step S15, various substrate processings are performed (substrate processing process).

For example, wafer W held by clamp members 43 is rotated by rotating holding plate 42 by rotation mechanism 35. Thereafter, a processing liquid such as SC1 is supplied to rotating wafer W by nozzle block 61. Subsequently, a rinse liquid such as deionized water is supplied to wafer W supplied with the processing liquid by nozzle block 61. Thereafter, wafer W supplied with the rinse liquid is rotated at high speed to be subjected to a spin drying.

After step S15 (substrate processing process), while at step S16, laser beam L is emitted from light source 88 (laser ON) and at step S17, the holding plate 42 is aligned, the determination process (determination processing) of steps S31 to S35 may be performed. By doing this, it can be verified that the holding state of wafer W after the substrate processing process is normal.

In this case, from the viewpoint of accuracy, the detection may be performed at the same position as the position detected before the processing process. When at the same position, the holding state is normal before processing, but is abnormal after processing, it may be detected that wafer W is not properly held by clamp members 43 during processing or there is an error, for example, wafer W is cracked.

While the determination process (determination processing) of steps S31 to S35 is performed, immediately after the detection process (step S31) several times is completed, at step S18, rotation of motor 51 of rotation mechanism 35 stops (motor rotation stop), and rotation of wafer W held by clamp members 43 also stops.

Subsequently, at step S19, emission of laser beam L from light source 88 stops (laser OFF). Thereafter, at step S20, lift pin plate 41 is moved to the upper location by elevation mechanism 47 to lift up wafer W to the transfer position (upper location). Thereafter, wafer W is carried-out from liquid processing unit 22 by transport mechanism 24 (transfer process). Carried-out wafer W is disposed on transfer rack 20 of transfer stage 19 by transport mechanism 24 and returned to wafer carrier WC from transfer rack 20 by transport mechanism 15.

The processing of single wafer W ends by the series of processes as described above.

Next, a second exemplary embodiment of a substrate processing method which is performed using liquid processing unit 22 by control unit 100 will be described. In the second exemplary embodiment, I/O board 105 has port PRT2 that inputs and outputs an analog signal in addition to port PRT1 that inputs and outputs a digital signal. The detection values of the light amount detected by light receiving element 89 are accumulated as analog data. The other configuration is the same as in the first exemplary embodiment, and thus a detailed description thereof is omitted.

Figure 17:
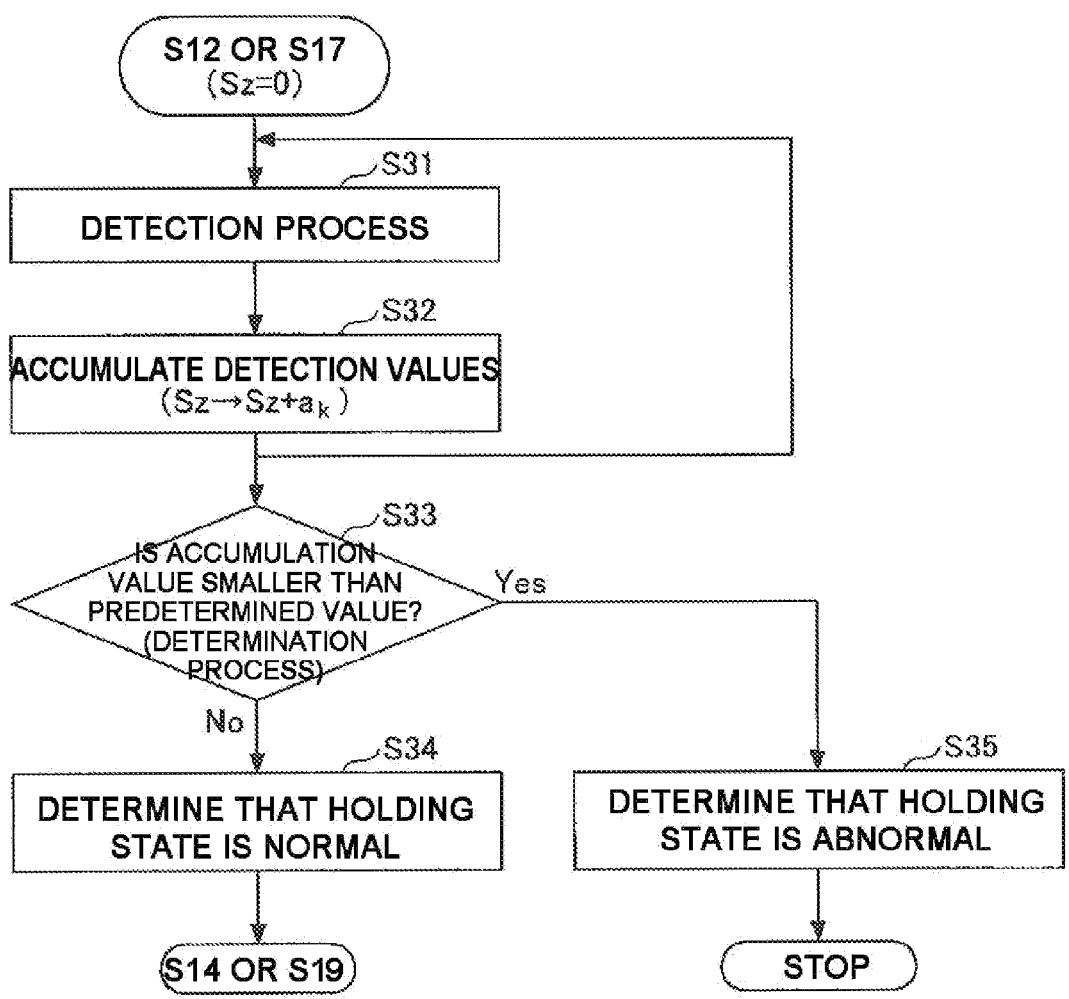
FIG. 17 is a flowchart illustrating an order of processes in another substrate processing method using a substrate processing apparatus according to a second exemplary embodiment of the present disclosure.

FIGS. 10 and 17 are flowcharts illustrating an order of respective processes in a substrate processing method using the substrate processing apparatus according to the present exemplary embodiment.

A holding process of step S11 and laser ON of step S12 are performed similarly as in the first exemplary embodiment. The emitted laser light L is irradiated to area A1 except for the center of wafer W on the top surface of wafer W through transmissive member 31c of casing 31. Thereafter, at step S13, while wafer W held by clamp members 43 is rotated (starting rotation of motor) together with clamp members 43 about the center of holding plate 42 as a rotation axis by motor 51, steps S31 to S35 illustrated in FIG. 17 are performed.

At step S31, the light irradiated to wafer W is reflected from the top surface of wafer W, mirror member 90 and the top surface of wafer W again, and the light amount of reflected light L3 is detected by light receiving element 89 of laser sensor 45 (detection process). In this case, the detection value of light amount detected by light receiving element 89 of laser sensor 45 is relatively large when the holding state of wafer W is normal, and the detection value is relatively small when the holding state is abnormal, as in the first exemplary embodiment.

At step S32, the detection values of light amount are accumulated. Before performing the processing, an accumulation parameter 'Sz' as an accumulation value of the detected values is set to 0 in advance. Then, at step S32, accumulation parameter 'Sz' is set to '$S_z + a_k$' by adding a detection value '$a_k$' to the present value 'Sz', and step S31 (detection process) and step S32 (accumulation process) are performed again.

In this way, after performing step S31 (detection process) and step S32 (accumulation process) several times, step S33 is performed. At step S33, it is determined whether the accumulation value obtained by accumulating the detection values is smaller than a predetermined value or not (determination process).

Figure 18:
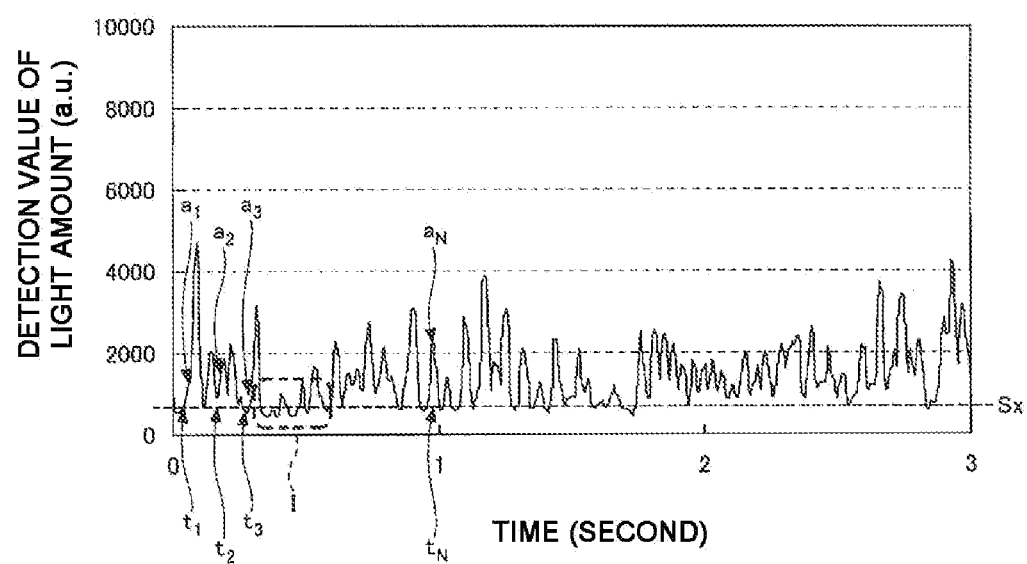
FIG. 18 is a graph schematically illustrating an example of a relationship between a time and a detection value of light amount when a holding state of a wafer is normal.
Figure 19:
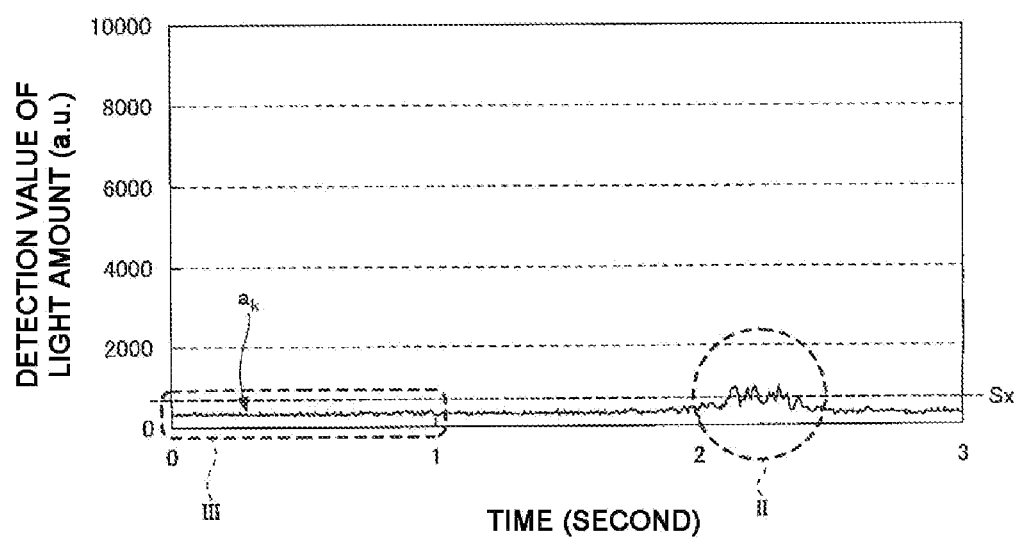
FIG. 19 is a graph schematically illustrating an example of a relationship between a time and a detection value of light amount when a holding state of a wafer is abnormal.
Figure 20:
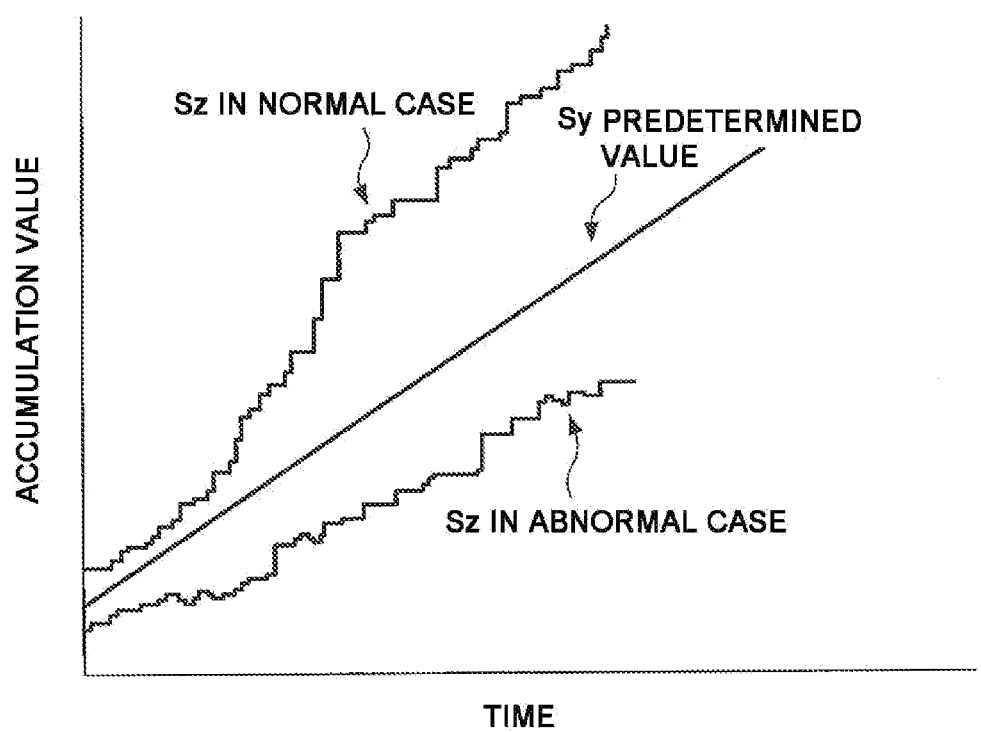
FIG. 20 is a graph schematically illustrating an example of a relationship between a time and an accumulation value of detection values when a holding state of a wafer is normal and when the holding state of the wafer is abnormal.

FIG. 18 is a graph schematically illustrating an example of a relationship between a time and a detection value of light amount when a holding state of a wafer W is normal. FIG. 19 is a graph schematically illustrating an example of a relationship between a time and a detection value of light amount when a holding state of a wafer W is abnormal. FIG. 20 is a graph schematically illustrating an example of a relationship between a time and an accumulation value of detection values when a holding state of a wafer W is normal and when the holding state of wafer W is abnormal.

The predetermined value which is compared with the accumulation value is denoted by 'Sy' in FIG. 20 and is determined in advance before the processing is performed. Specifically, for example, the predetermined value may be determined as follow. A detection value when the holding state of wafer W is normal as illustrated in FIG. 18 and a detection value when the holding state of wafer W is abnormal as illustrated in FIG. 19 are detected in advance. In the abnormal case, a plurality of cases are detected, and respective accumulation values are calculated. Thereafter, as illustrated in FIG. 20, predetermined value 'Sy' is set to be between the minimum value of the accumulation value of the detection values in the normal case and the maximum value of the accumulation value of the detection values in the abnormal case, and a threshold value 'Sx' is determined such that determined value 'Sy' is a value obtained by accumulating threshold value 'Sx' several times. By doing this, when accumulation value 'Sz' is predetermined value 'Sy' or more, it may be determined that the holding state of wafer W is normal, and when accumulation value 'Sz' is smaller than predetermined value 'Sy', it may be determined that the holding state of wafer W is abnormal.

At step S33, since step S31 and step S32 have been repeated, for examples, n times, accumulation parameter 'Sz' that is the accumulation value obtained by accumulating detection values '$a_k$' is represented by following Equation 1

[Equation 1]

$$Sz = \sum_{k=1}^{n} a_k \qquad (1)$$

Accumulation parameter 'Sz' represented by Equation 1 is the sum of, for example, detection values $a_1, a_2, a_3, \ldots, a_N$ at the time $t_1, t_2, t_3, \ldots, t_N$ in FIG. 18.

In the example illustrated in FIGS. 18 and 19, wafer W is rotated in the range of 360°, and in this case, step S31 (detection process) and step S32 (accumulation process) may be performed several times.

At step S33, when accumulation parameter 'Sz' is predetermined value 'Sy' or more, it is determined that the holding state of wafer W is normal (step S34), and the process proceeds to step S14.

Meanwhile, when accumulation parameter 'Sz' is smaller than predetermined value 'Sy', it is determined that the holding state of wafer W is abnormal (step S35), and the processing stops. Alternatively, instead of stopping the processing, wafer W may be held by clamp members 43 again. In other words, pressed member 43c pressed downward by the bottom surface of lift pin plate 41 is released by moving lift pin plate 41 from the lower location to the upper location by elevation mechanism 47, and wafer W held by clamp members 43 is released by rotating clamp members 43 about shaft 43a (see FIG. 6). Thereafter, pressed member 43c may be pressed downward by the bottom surface of lift pin plate 41 by moving lift pin plate 41 to the lower location again, and wafer W may be held again from the lateral side by holding members 43b of clamp members 43 by rotating clamp members 43 about shaft 43a (see FIG. 5). In other words, when it is determined that the holding state of wafer W is abnormal, wafer W may be held again by retreating and advancing holding members 43b of clamp members 43 from and to wafer W.

At step S32 (accumulation process), the detection values of light amount detected by light receiving element 89 are accumulated as analog digital. When the detection value is changed as illustrated in FIG. 18, the detection values of the light amount detected by light receiving element 89 are accumulated as analog data, thereby improving precision of obtained accumulated value compared to a case where the detection values are converted into digital data and accumulated.

When the holding state of wafer W is normal, as illustrated in FIG. 18, a relatively large detection value is detected regardless of the detection position. Meanwhile, when the holding state of wafer W is abnormal, as illustrated in FIG. 19, a relatively small detection value is detected. However, for example, when the laser beam is reflected from the top surface of wafer W, the detection value of the light amount may be different from the assumed value by being affected by a kind of layers formed on wafer W and a surface state of a layer processed on wafer W. Specifically, when the detection position on wafer W is changed, the detection value may be significantly changed depending on the detection position by being affected by a surface state a layer processed on wafer W. When the detection position on wafer W is changed, the detection value may be significantly changed depending on the detection position by the relationship between the clamp members 43 surmounted by wafer W and the detection position.

In the example illustrated in FIG. 18, when step S31 (detection process) and step S32 (accumulation process) are repeated for 3 seconds, in some cases, detection value '$a_k$' of light amount is smaller than threshold value '$S_x$' (an area I surrounded by a dotted line in FIG. 18). It is considered that this mainly results from the effect of the surface state of wafer W.

In an example illustrated in FIG. 19, when step S31 (detection process) and step S32 (accumulation process) are repeated for 3 times, the detection value '$a_k$' of light amount is larger than threshold value '$S_x$' in an area where the time is 2 to 3 seconds (an area II surrounded by dotted line of FIG. 19). This phenomenon may be observed when a direction toward clamp members 43 surmounted by wafer W from the center of wafer W is, for example, parallel with a direction of any one of lights L, L1, L2 and L3 when viewed from above.

Therefore, as illustrated in FIG. 7, while the detection position on wafer W is changed, the determination process (determination processing) is performed several times, and a plurality of accumulation values are accumulated. By doing this, the effects of a kind of layers formed on wafer W and the surface state of a layer processed on wafer W may be eliminated, and as a result, even though there is an area such as area I or area II, the holding state of wafer W may be exactly determined without erroneous detection.

When wafer W is placed on clamp member 43-1 or clamp member 43-2, the detection value is small at detection positions except for the periphery thereof. When wafer W is placed on clamp member 43-3, all the detection values between clamp member 43-1 and clamp member 43-2 are small. Therefore, when the detection values are detected between two of the three clamp members, a point having a small detection value increases as shown in an area III surrounded by a dotted line in FIG. 19. As expressed by the accumulation value in the abnormal case of FIG. 20, the accumulation value of the detection values is lower than the accumulation value of threshold values, and as a result, it may be determined that the holding state of wafer W is abnormal. Accordingly, since the holding state of wafer W may be exactly detected without rotating wafer W over the entire circumference (360°), it is possible to improve the throughput.

In the present exemplary embodiment, for example, three clamp members 43 are installed at regular intervals, that is, every detection position of 120° along the circumferential direction of wafer W. Thus, wafer W may be rotated in the range of, for example, 120° at least from a first detection position corresponding to clamp member 43-1 to a second detection position corresponding to clamp member 43-2 next to clamp member 43-1.

At step S33, when it is determined that the holding state of wafer W is normal (step S34), the subsequent processing is performed similarly as in the first exemplary embodiment.

As described above, the exemplary embodiments of the present disclosure have been described, but the present disclosure is not limited to the specific exemplary embodiments, and various modifications and changes can be made without departing from the scope and spirit included in the appended claims.

For example, the light irradiated from the light source is limited to the laser beam, but the irradiated light may be light irradiated from various light sources such as an LED.

For example, the processing using a processing liquid may be applied to a coating process of coating a resist film, a thermal processing of heating or cooling the coated resist film, a developing process of performing development using, for example, an alkaline developing liquid after exposing the resist film, and a rinsing process after the developing process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus of processing a substrate, comprising:
    a placement table on which the substrate is disposed;
    a plurality of holders each configured to hold a circumferential edge of the substrate disposed on the placement table;
    a light source configured to irradiate light on the surface of the substrate on the placement unit;
    a detector configured to detect the light amount reflected from the surface of the substrate; and
    a control unit configured to perform a determination process of determining whether a detection value of the light amount is smaller than a predetermined value at a plurality of positions, and to determine that a holding state of the substrate is abnormal when the total number of determination counted where the detection value is determined to be smaller than the predetermined value reaches a predetermined number of times,
    wherein the control unit performs the determination process several times while changing the detection position of the substrate from a first detection position corresponding to one holder to a second detection position corresponding to another holder next to the one holder.

2. The substrate processing apparatus of claim 1, further comprising:
    a rotation unit configured to rotate the substrate together with the placement table about the center of the placement table as a rotation axis,
    wherein the control unit performs the determination process several times while consecutively changing the detection position by the rotation unit.

3. The substrate processing apparatus of claim 2, wherein when the control unit performs the determination process several times, if it is determined that the detection value is smaller than the predetermined value consecutively for the predetermined number of times, the control unit determines that the holding state of the substrate is abnormal.

4. The substrate processing apparatus of claim 1, wherein the light source irradiates light to an area other than the center of the substrate on the surface of the substrate.

5. The substrate processing apparatus of claim 1, wherein the control unit performs the determination process before the substrate is processed and performs the determination process after the substrate is processed.

6. A substrate processing method of processing a substrate, comprising:
    holding the substrate disposed on a placement table by a holder;
    irradiating light on the surface of the substrate on the holder;
    detecting the light amount reflected from the surface of the substrate by a detector; and
    determining whether a detected value of the light amount is smaller than a predetermined value by a control unit,
    wherein a plurality of holders are installed at regular intervals along an outer circumference of the substrate to hold a circumferential edge of the substrate,
    the detecting is performed at a plurality of positions of the substrate while the detection position of the substrate is changed from a first detection position corresponding to one holder to a second detection position corresponding to another holder next to the one holder,
    the determining determines that the holding state of the substrate is abnormal when the total number of determination counted where the detection value is determined to be smaller than the predetermined value reaches a predetermined number of times,
    when the determining is performed several times, if the total number of times reaches the predetermined number of times, it is determined that the holding state of the substrate is abnormal.

7. The substrate processing method of claim 6, wherein the detecting is performed several times while the detection position is consecutively changed by rotating the substrate on the holder about the center of the placement table as a rotation axis.

8. The substrate processing method of claim 7, wherein when the determining is performed several times, if it is determined that the detection value is smaller than the predetermined value consecutively for the predetermined number of times, it is determined that the holding state of the substrate is abnormal.

9. The substrate processing method of claim 6, wherein the detecting detects the light amount irradiated to an area other than the center of the substrate on the surface of the substrate and reflected from the area.

10. The substrate processing method of claim 6, wherein the determining is performed before the substrate is processed, and the determining is preformed after the substrate is processed.

11. A non-transitory computer-readable storage medium storing a computer program that, when executed, causes a computer to perform the substrate processing method of claim 6.

12. A substrate processing apparatus of processing a substrate, comprising:
- a placement table on which the substrate is disposed;
- a rotation unit configured to rotate the substrate together with the placement table about the center of the placement table as a rotation axis;
- a plurality of holders each configured to hold a circumferential edge of the substrate disposed on the placement table;
- a light source configured to irradiate light on the surface of the substrate on the placement table;
- a detector configured to detect a light amount reflected from the surface of the substrate; and
- a control unit configured to perform a detection process of detecting the light amount using the detector at a plurality of positions, accumulate the detection values of the light amount, and determine that a holding state of the substrate is abnormal when the accumulated value is smaller than a predetermined value,
- wherein the control unit performs the detection process several times while the detection position of the substrate is changed from a first detection position corresponding to one holder to a second detection position corresponding to another holder next to the one holder, and when the accumulated value is smaller than the predetermined value, the control unit determines that the holding state of the substrate is abnormal.

13. The substrate processing apparatus of claim 12, wherein the control unit performs the detection process several times, accumulates the detection values as analog data, and when the accumulated value is smaller than the predetermined value, the control unit determines that the holding state of the substrate is abnormal.

14. The substrate processing apparatus of claim 12, wherein the control unit performs the detection process before the substrate is processed and performs the detection process after the substrate is processed.

15. A substrate processing method of processing a substrate, comprising:
- holding the substrate disposed on a placement table by a holder;
- irradiating light on the surface of the substrate on the holder;
- detecting a light amount reflected from the surface of the substrate by a detector;
- performing the detecting at a plurality of positions of the substrate, accumulating the detection values of the light amount detected by the detector, and determining that the holding state of the substrate is abnormal when the accumulated value is smaller than a predetermined value by a control unit,
- wherein a plurality of holders are installed at regular intervals along an outer circumference of the substrate to hold a circumferential edge of the substrate, and
- the determining determines that the holding state of the substrate is abnormal when the detecting is performed several times while the detection position of the substrate is changed from a first detection position corresponding to one holder to a second detection position corresponding to another holder next to the one holder, if the accumulated value is smaller than the predetermined value.

16. The substrate processing method of claim 15, wherein the determining determines that the holding state of the substrate is abnormal, when the detecting is performed several times, and the detection values are accumulated as analog data, if the accumulated value is smaller than the predetermined value.

17. The substrate processing method of claim 15, wherein the determining is performed before the substrate is processed, and the determining is preformed after the substrate is processed.

18. A non-transitory computer-readable storage medium storing a computer program that, when executed, causes a computer to perform the substrate processing method of claim 15.

* * * * *